United States Patent
Park et al.

(10) Patent No.: US 10,700,544 B2
(45) Date of Patent: Jun. 30, 2020

(54) WIRELESS POWER TRANSMISSION DEVICE AND SYSTEM USING IMPEDANCE MATCHING

(71) Applicant: KOREA ELECTROTECHNOLOGY RESEARCH INSTITUTE, Changwon (KR)

(72) Inventors: Young Jin Park, Seoul (KR); Jin Wook Kim, Ansan (KR)

(73) Assignee: KOREA ELECTROTECHNOLOGY RESEARCH INSTITUTE, Changwon (KR)

(*) Notice: Subject to any disclaimer, the term of this patent is extended or adjusted under 35 U.S.C. 154(b) by 61 days.

(21) Appl. No.: 15/887,847

(22) Filed: Feb. 2, 2018

(65) Prior Publication Data

US 2018/0159359 A1    Jun. 7, 2018

Related U.S. Application Data

(63) Continuation-in-part of application No. PCT/KR2016/008511, filed on Aug. 2, 2016.

(30) Foreign Application Priority Data

Aug. 4, 2015    (KR) ........................ 10-2015-0110247

(51) Int. Cl.
*H02J 7/00*    (2006.01)
*H02J 7/02*    (2016.01)
(Continued)

(52) U.S. Cl.
CPC ............ *H02J 7/025* (2013.01); *H02J 7/0024* (2013.01); *H02J 7/0027* (2013.01); *H02J 50/12* (2016.02); *H02J 50/40* (2016.02); *H03H 7/38* (2013.01)

(58) Field of Classification Search
CPC .. H02J 7/025; H02J 50/12; H02J 50/40; H02J 7/0024; H02J 7/0027
(Continued)

(56) References Cited

U.S. PATENT DOCUMENTS

| 2011/0080051 A1* | 4/2011 | Lee | ........................ H02J 50/90 |
| | | | 307/104 |
| 2012/0153732 A1* | 6/2012 | Kurs | ..................... B60L 3/0069 |
| | | | 307/104 |

(Continued)

FOREIGN PATENT DOCUMENTS

| KR | 10-2013-0087708 A | 8/2013 |
| KR | 10-2014-0008020 A | 1/2014 |
| KR | 10-2014-0071233 A | 6/2014 |

OTHER PUBLICATIONS

International Search Report for PCT/KR2016/008511 filed on Aug. 2, 2016.

(Continued)

*Primary Examiner* — Zixuan Zhou

(57) ABSTRACT

The present invention relates to a battery charging system using wireless power transmission, including a charging power supply device that comprises: a power supply unit that supplies power for wireless power transmission; a power transmission unit that comprises at least one power transmission coil and wirelessly transmits power for charging a battery; and a transmission impedance matching unit that matches the impedance between the power supply unit and the power transmission unit; and a battery charging device that receives power wirelessly transmitted from the charging power supply device through power reception coils individually corresponding to one or more batteries and charges the batteries. According to the present invention, a plurality of unit batteries can be simultaneously charged by one charging power supply device, that is, one transmission (Continued)

module. With this advantage, a plurality of battery cells can be simultaneously charged wirelessly without wires, and quick charging is also possible.

20 Claims, 18 Drawing Sheets

(51) Int. Cl.
　　　*H02J 50/12*　　(2016.01)
　　　*H02J 50/40*　　(2016.01)
　　　*H03H 7/38*　　(2006.01)
(58) Field of Classification Search
　　　USPC .......................................... 320/108; 307/104
　　　See application file for complete search history.

(56) References Cited

U.S. PATENT DOCUMENTS

| | | | |
|---|---|---|---|
| 2012/0313447 A1* | 12/2012 | Park | H02J 5/005 |
| | | | 307/104 |
| 2013/0057082 A1* | 3/2013 | Takada | B60L 53/36 |
| | | | 307/104 |
| 2014/0184147 A1 | 7/2014 | Uchida | |
| 2014/0253029 A1 | 9/2014 | Uchida et al. | |

OTHER PUBLICATIONS

Jinwook Kim et al., "Analysis of Capacitive Impedance Matching Networks for Simultaneous Wireless Power Transfer to Multiple Devices", IEEE Transactions on Industrial Electronics, May 2015, pp. 2807-2813, vol. 62, No. 5, IEEE.

* cited by examiner

WIRELESS POWER TRANSMISSION DEVICE AND SYSTEM USING IMPEDANCE MATCHING

CROSS REFERENCE TO RELATED APPLICATION

This application is a by-pass continuation in part of international Patent Application No. PCT/KR2016/008511 Filed Aug. 2, 2016, which claims priority to Korean application KR 10-2015-0110247, filed Aug. 4, 2015, the disclosures of which are incorporated herein by reference in their entirety.

TECHNICAL FIELD

The present invention relates to a wireless power transmission device and system, and more particularly, a wireless power transmission device and system using impedance matching, which include a wireless power transmitter including at least one power transmission coil and a transmission impedance matching circuit therefor, and a wireless power receiver including a power reception coil and a reception impedance matching circuit therefor and receiving power wirelessly transmitted from the wireless power transmitter, wherein the transmission impedance matching circuit and the reception impedance matching circuit are adjusted according to a state of a load such as a secondary battery to which received power is supplied, thereby effectively distributing and supplying power to the load such as one or more secondary batteries.

BACKGROUND ART

Recently, the use of mobile information devices including smartphones and wireless terminals such as mobile healthcare terminals has been rapidly increasing. Such wireless terminal devices are usually supplied with power by using a secondary battery embedded in the devices. Generally, since the capacity of the secondary battery is small, the secondary battery cannot be used for a long time with a single charge, and accordingly, it is inconvenient to periodically charge the secondary battery.

Generally, a wired charging method using a DC adapter is commonly used for charging. However, in this case, it is inconvenient for a user to directly connect a wireless terminal to a wired adapter. In particular, since a wearable device such as a smart watch is small, a connection work for wired charging is more difficult. In addition, in the case of wired charging, since a plurality of wired charging adapters have to be used for simultaneously charging a plurality of batteries or loads, charging cost increases and charging becomes complicated. Therefore, there is a need for a method of simultaneously charging various wireless terminal devices in a simple manner without using a plurality of adapters.

Recently, magnetic coupled resonant wireless power transfer technology has attracted attention. The magnetic coupled resonant wireless power transfer technology basically transmits power by using time-varying magnetic field coupling at a short distance. An independent self-resonator having a high quality factor (Q-factor) of several tens or more is used in a transmission/reception unit, or a self-inductance of a transmission/reception self-resonant coil increases and a resistance decreases, so that a quality coefficient of a transmission/reception coil has at least several tens or more. Based on this technology, it is possible to improve an effective power transmission distance that can be recharged, and it is possible to perform free positioning charging to any load existing within a certain range in space. In particular, the magnetic coupled resonant wireless power transfer technology has an advantage that can simultaneously transmit power to multiple loads.

However, when power is transmitted to multiple loads, an optimum impedance matching condition is changed according to the position and the charging state of the load. Accordingly, when the optimum impedance matching condition is changed, the power transfer efficiency for each load is deteriorated. In addition, in the case of multiple loads, a charging current or voltage for each load is changed according to a state of a battery. Thus, a need for a method of supplying power required by the individual battery as appropriately as possible is required for efficiently charging each battery. For example, in a case where two loads are simultaneously charged by one input, if a large amount of power is required in one load and a relatively small amount of power is required in the other load, it is more preferable to adjust the supply of power to each load by taking into account the state of each load.

Therefore, there is a need for a method that can optimize the supply of power to a plurality of loads, for example, by appropriately distributing power to each load by controlling the supply of power to each load by taking into account the state of each load such as a battery, and further, efficiently charging a plurality of batteries, but a suitable alternative has not been proposed.

DETAILED DESCRIPTION OF THE INVENTION

Technical Problem

The present invention has been made to solve the above problems of the prior art, and it is an object of the present invention to provide a wireless power transmission device and system capable of efficiently distributing power to various loads, such as simultaneously charging various types of secondary batteries in an effective manner by using wireless power transmission technology.

In particular, the present invention provides a method of simultaneously supplying power to loads such as a plurality of secondary batteries in an efficient manner by using a single charging power supply device while taking into account individual characteristics of various types of secondary batteries.

In addition, the present invention provides an impedance matching method capable of efficiently transmitting power according to a state of a load in an environment in which a plurality of electronic and electrical device loads having independent batteries existing in an effective wireless charging space are present.

Furthermore, the present invention provides a method of preventing a heat generation problem and electromagnetic interference (EMI) that may occur when impedance is not properly matched or appropriate power is not supplied to individual loads.

Technical Solution

According to one aspect of the present invention, a battery charging system using wireless power transmission includes: a charging power supply device that includes: a power supply unit that supplies power for wireless power transmission; a power transmission unit that includes at least one power transmission coil and wirelessly transmits power for charging a battery; and a transmission impedance matching unit that matches impedance between the power supply unit and the power transmission unit; and a battery charging device that receives power wirelessly transmitted from the charging power supply device through power reception coils individually corresponding to one or more batteries and charges the batteries.

The power transmission unit may include two or more power transmission coils connected to an output terminal of the transmission impedance matching unit.

The transmission impedance matching unit may further include a transmission coupling coil, the power transmission coil may include a transmission self-resonant coil that transmits power to the power reception coil through magnetic coupling to the transmission coupling coil, and the transmission coupling coil may act as an inductance component to contribute to impedance matching.

A size of the transmission coupling coil, a number of turns of the transmission coupling coil, or a spacing between the transmission coupling coil and the transmission self-resonant coil may be adjusted so as to adjust mutual inductance with the transmission self-resonant coil.

According to another aspect of the present invention, a battery charging system using wireless power transmission includes: a charging power supply device that wirelessly transmit power through at least one power transmission coil; and a battery charging device including: a power reception unit including a power reception coil that receives power wirelessly transmitted from the charging power supply device; a battery charging unit that supplies the power received from the power reception unit to a battery; and a reception impedance matching unit that performs impedance matching between the power reception unit and the battery charging unit, wherein the power reception unit, the reception impedance matching unit, and the battery charging unit of the battery charging device are individually provided for each of one or more batteries.

The reception impedance matching unit may include: a first reception capacitor connected in series to the power reception unit; and a second reception capacitor connected in parallel to the first reception capacitor connected in series to the power reception unit.

The reception impedance matching unit may include: a first capacitor connected in parallel to the power reception unit; and a second reception capacitor connected in series to the first reception capacitor connected in parallel to the power reception unit.

The reception impedance matching unit may include: a reception capacitor for impedance matching; and a reception coupling coil connected to an input terminal of the reception capacitor, the power reception coil may include a reception self-resonant coil that receives power from the charging power supply device and transmits the received power to the reception impedance matching unit through magnetic coupling to the reception coupling coil, and the reception coupling coil may act as an inductance component to contribute to impedance matching.

A size of the reception coupling coil, a number of turns of the reception coupling coil, or a spacing between the reception coupling coil and the reception self-resonant coil may be adjusted so as to adjust mutual inductance with the reception self-resonant coil.

According to another aspect of the present invention, a battery charging system using wireless power transmission includes: a charging power supply device that includes at least one power transmission coil and wirelessly transmits power for simultaneously charging a plurality of batteries; and a battery charging device that receives power wirelessly transmitted from the charging power supply device through power reception coils individually corresponding to the plurality of batteries and charges the plurality of batteries, the battery charging device including a reception control unit that controls power charged to each battery by taking into account a charging state of each of the plurality of batteries.

The reception control unit may be provided in plurality to individually correspond to the plurality of batteries.

The reception control unit may be implemented with one module that controls charging of the plurality of batteries.

The battery charging device may include a reception impedance matching unit including a first reception capacitor connected in parallel to an input terminal and a second reception capacitor connected in series to the first reception capacitor.

The battery charging device may include a reception impedance matching unit including a first reception capacitor connected in series to an input terminal and a second reception capacitor connected in parallel to the first reception capacitor.

The charging power supply device may include a transmission control unit that controls the wirelessly transmitted power, and the transmission control unit and the reception control unit may interwork with each other to adjust the wirelessly transmitted power and the charged power.

The transmission control unit may include a transmission communication unit for wired or wireless communication with the reception control unit, the reception control unit may include a reception communication unit for wired or wireless communication with the transmission control unit, and the transmission control unit may control a transmission power amount based on charging state information of the plurality of batteries that is transmitted from the reception control unit.

The battery charging device may include a reception impedance matching unit including a first reception capacitor connected in parallel to an input terminal and a second reception capacitor connected in series to the first reception capacitor.

The battery charging device may include a reception impedance matching unit including a first reception capacitor connected in series to an input terminal and a second reception capacitor connected in parallel to the first reception capacitor.

The transmission control unit of the charging power supply device may adjust impedance matching to control power supplied to the power transmission coil.

The reception control unit of the battery charging device may adjust impedance matching of each battery to control power charged to each battery.

According to another aspect of the present invention, a battery charging system using wireless power transmission includes: a charging power supply device that includes at least one power transmission coil and simultaneously transmits power wirelessly to a plurality of battery charging devices; and a battery charging device including: a power reception unit including a power reception coil that receives power wirelessly transmitted from the charging power supply device; a battery charging unit that supplies the power received from the power reception unit to a battery; and a reception impedance matching unit that performs impedance matching between the power reception unit and the battery charging unit, wherein the reception impedance matching unit includes: a first reception capacitor connected in parallel to the power reception unit; and a second reception capacitor connected in series to the first reception capacitor connected in parallel to the power reception unit.

The battery charging device may further include a control unit that adjusts impedance matching of the reception impedance matching unit to control power charged to each of the plurality of batteries.

The control unit may adjust impedance matching of a specific reception impedance matching unit to lower an impedance of a specific battery charging unit when viewed from the power reception unit, so as to increase a ratio of power supplied to the specific battery charging unit among powers transmitted from the charging power supply device.

The control unit may collect state information on a plurality of batteries from a plurality of battery charging units and adjust impedance matching of one or more battery charging units based on the state information, so as to adjust a ratio of power supplied to the one or more battery charging units among powers transmitted to the charging power supply device.

According to another aspect of the present invention, a battery charging system using wireless power transmission includes: a charging power supply device that includes at least one power transmission coil and simultaneously transmits power wirelessly to a plurality of battery charging devices; and a battery charging device including: a power reception unit including a power reception coil that receives power wirelessly transmitted from the charging power supply device; a battery charging unit that supplies the power received from the power reception unit to a battery; and a reception impedance matching unit that performs impedance matching between the power reception unit and the battery charging unit, wherein the reception impedance matching unit includes: a first reception capacitor connected in series to the power reception unit; and a second reception capacitor connected in parallel to the first reception capacitor connected in series to the power reception unit.

Even when impedances of the plurality of battery charging devices are changed, each of the battery charging devices may be charged within a predetermined power transfer efficiency range.

According to another aspect of the present invention, a wireless power transmission device capable of wirelessly transmitting power to a plurality of wireless power reception devices in a wireless power transmission system includes: a power transmission unit that includes at least one power transmission coil and transmits power to the wireless power reception devices; a power supply unit that supplies power to the power transmission unit; a transmission impedance matching unit that matches impedance between the power supply unit and the power transmission unit; and a transmission control unit that controls the power wirelessly transmitted to the wireless power reception devices, wherein the transmission control unit interworks with the wireless power reception devices to control the wirelessly transmitted power.

According to another aspect of the present invention, a wireless power reception device that receives power from a wireless power transmission device capable of wirelessly transmitting power to a plurality of wireless power reception devices in a wireless power transmission system includes: a power reception unit including a power reception coil that receives power wirelessly transmitted from a charging power supply device; a module power supply unit that supplies the power received from the power reception unit to another module; and a reception impedance matching unit that performs impedance matching between the power reception unit and the module power supply unit.

The reception impedance matching unit may include at least one reception capacitor, and a reception self-resonant coil that transmits received power to the reception impedance matching unit through magnetic coupling to the power reception coil, and the reception coupling coil may act as an inductance component to contribute to impedance matching.

The wireless power reception device may further include a control unit that controls impedance matching of the reception impedance matching unit and controls power supplied to the module power supply unit.

The control unit may control the impedance matching of the reception impedance matching unit by taking into account a state of the module measured by the module power supply unit.

The control unit may interwork with the wireless power transmission devices to control the wirelessly transmitted power and the power supplied to the module power supply unit.

The reception impedance matching unit may include a reception impedance matching unit including a first reception capacitor connected in parallel to the power supply unit and a second reception capacitor connected in series to the first reception capacitor.

The reception impedance matching unit may include a reception impedance matching unit including a first reception capacitor connected in series to the power supply unit and a second reception capacitor connected in parallel to the first reception capacitor.

Advantageous Effects

According to the present invention, a plurality of secondary batteries can be simultaneously charged by one charging power supply device, that is, one transmission module. With this advantage, the plurality of batteries can be simultaneously charged wirelessly without wires. Furthermore, the present invention is not necessarily limited to the charging of the secondary battery, and the present invention can effectively implement wireless power transmission for various modules.

Furthermore, power can be efficiently transmitted to individual batteries and a plurality of batteries or loads through the impedance matching method according to the present invention, thereby improving the power transfer efficiency of the system. In addition, it is possible to solve heat generation problems, system instability problems, and electromagnetic interference problems caused by impedance mismatching.

A plurality of individual batteries can be simultaneously charged without a wired adapter, and the charging cost is much lower than the method of charging individual batteries by wire.

Furthermore, according to the present invention, in at least one battery charging devices that receives power from a charging power supply device through wireless transmission, a reception impedance matching unit between a power reception unit and a battery charging unit includes a first reception capacitor connected in parallel to the power reception unit and a second reception capacitor connected in series to the first reception capacitor, so that more power is distributed to a battery requiring a relatively large amount of charging among a plurality of batteries, thereby enabling quick charging.

MODE OF THE INVENTION

Hereinafter, exemplary embodiments of the present invention will be described in detail with reference to the accompanying drawings.

The terms used in the present specification are merely used to describe particular embodiments, and are not intended to limit the present invention. An expression used in the singular encompasses the expression in the plural, unless it has a clearly different meaning in the context. In the present specification, it is to be understood that tams such as "including" or "having", etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Also, while describing the present invention, detailed descriptions about related well-known functions or configurations that may diminish the clarity of the points of the present invention are omitted.

One embodiment of the present invention provides a battery charging system in which a charging power supply unit including one or more power transmission coils wirelessly transmits charging power to a power reception coil individually provided for each of a plurality of batteries, thereby simultaneously performing charging by taking into account characteristics of the plurality of batteries.

In particular, since different types of electronic devices may include rechargeable batteries having different characteristics, one embodiment of the present invention provides a method of simultaneously charging various types of electronic devices in an efficient manner by taking into account charging characteristics of each rechargeable battery.

In addition, one embodiment of the present invention provides a method of easily and efficiently charging a plurality of loads having independent batteries in a charging region.

Furthermore, the present invention is not limited to the charging system for the plurality of batteries, and one embodiment of the present invention provides a wireless power transmission system capable of wirelessly transmitting power by taking into account the states and characteristics of a plurality of loads.

Figure 1:
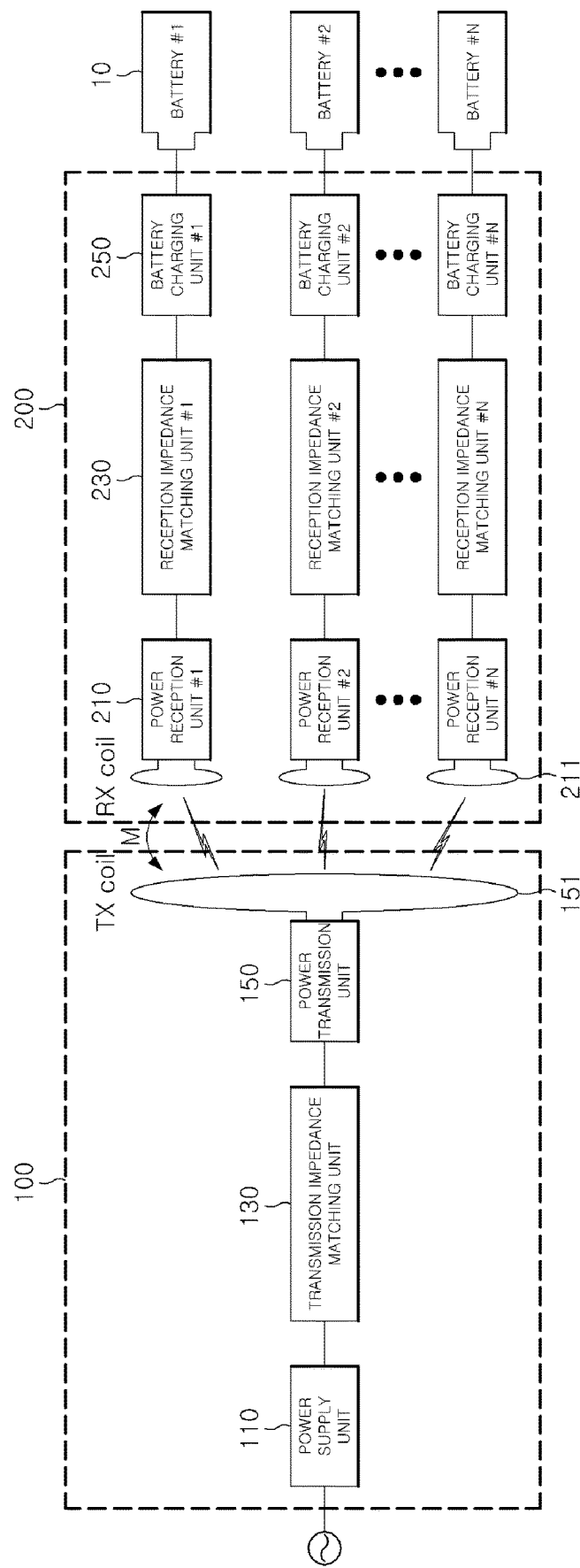
FIG. 1 is a configuration diagram of an embodiment of a plurality of battery charging systems using wireless power transmission, according to the present invention.

FIG. 1 is a configuration diagram of a first embodiment of a battery charging system using wireless power transmission, according to the present invention.

Referring to FIG. 1, the battery charging system using wireless power transmission according to the first embodiment of the present invention may include a charging power supply device 100 and a battery charging device 200.

The wireless power transmission as illustrated in FIG. 1 is performed between the charging power supply device 100 and the battery charging device 200. Various methods for wireless power transmission, for example, any methods for wireless power transmission, such as magnetic resonance or magnetic induction methods, may be applied. Specific examples of the charging power supply device 100 and the battery charging device 200 can include a charger for wirelessly transmitting power to a terminal, a terminal such as a smartphone for wirelessly receiving the power from the charger, and the like.

The charging power supply device 100 receives external power, generates power suitable for charging by taking into account various battery characteristics and charging conditions, and wirelessly transmits the generated power, and the battery charging device 200 determines the characteristics and the charging condition of a battery to be charged, receives power wirelessly transmitted from the charging power supply device 100, and charges the battery.

Each component will be described in more detail. First, the charging power supply device 100 may include a power supply unit 110, a transmission impedance matching unit 130, and a power transmission unit 150.

The power supply unit 110 receives external power or the like in order for wireless power transmission and supplies the received external power to the power transmission unit 150. For example, the power supply unit 110 may generate an AC signal by using a switching inverter, or receive DC power, and generate an AC signal (for example, several tens of kHz to several hundreds of MHz) necessary for power transmission by using a circuit such as an oscillator and an amplifier.

The transmission impedance matching unit 130 is connected to the power supply unit 110 to perform impedance matching for maximum power transmission to the wireless power to be transmitted, and transmits power by wire or wireless according to the AC signal generated by the power supply unit 110.

The power transmission unit 150 is a device that converts the AC signal received through the transmission impedance matching unit 130 into a time-varying magnetic field or a time-varying electric field. The time-varying magnetic field or the time-varying electric field generated by the power transmission unit for near-field magnetic coupled wireless power transmission should not radiate to space as much as possible. For wireless power transmission, the power transmission unit 150 includes at least one power transmission coil 151. In addition, the power transmitting unit may constitute a circuit in the power transmission coil 151 so that the power transmission coil 151 resonates at a desired frequency, and the resonant frequency may be varied by adjusting the power transmission unit.

Here, as the impedance matching method, the impedance when looking at the power supply unit 110 from the transmission impedance matching unit 130 and the impedance when looking at the power supply unit 110 may be adjusted to be complex conjugates.

Further, it is possible to measure a voltage and a current in the power supply unit 110 and the power transmission unit 150, determine an impedance matching state based on the measured voltage and current, and adjust impedance matching by taking into account the impedance matching state. A control circuit therefor may be added.

Next, the battery charging device 200 may include a power reception unit 210, a reception impedance matching unit 230, and a battery charging unit 250. Preferably, as illustrated in FIG. 1, the power reception unit 210, the reception impedance matching unit 230, and the battery charging unit 250 may be configured to correspond to each of the plurality of batteries 10. Each power reception unit constitutes a circuit in the reception coil so that a power reception coil 211 resonates at a desired frequency, and the resonant frequency may be varied by adjusting the power reception unit.

The power reception unit 210 includes the power reception coil 211 for receiving power wirelessly transmitted from the charging power supply device 100. The power reception coil 211 is magnetic-coupled from the power transmission coil 151 of the charging power supply device 100 connected by time-varying magnetic field coupling, and generates an AC voltage.

The reception impedance matching unit 230 performs impedance matching for maximum power reception and transmits the power, voltage, or current generated by the power reception unit 210 to the battery charging unit 250.

Here, as the reception impedance matching method, the impedance when looking at the battery charging unit 250 from the reception impedance matching unit 230 and the impedance when looking at the power reception unit 210 may be adjusted to be complex conjugates.

Further, it is possible to measure a voltage or a current in the battery charging unit 250 and the power reception unit 210, determine an impedance matching state based on the measured voltage or current, and adjust impedance matching by taking into account the impedance matching state. A control circuit therefor may be added.

At this time, the battery charging unit 250 may include a rectification circuit. The battery charging unit 250 converts the AC signal transmitted from the reception impedance matching unit 230 to a DC signal. The battery charging unit 250 includes a charging circuit according to a constant voltage or constant current method and processes a DC current to charge the battery 10. Further, the battery charging unit 250 may check a remaining charging amount of the battery 10 and use the remaining charging amount as charging state information of the battery 10.

In addition, as described above, the power supplied to the battery 10 may be controlled by adjusting the impedance matching in the reception impedance matching unit 230 by taking into account the measured charging state of the battery 10.

Here, the battery 10 may be an independent battery that is individually mounted on an electronic device such as a mobile device.

Figure 2A:
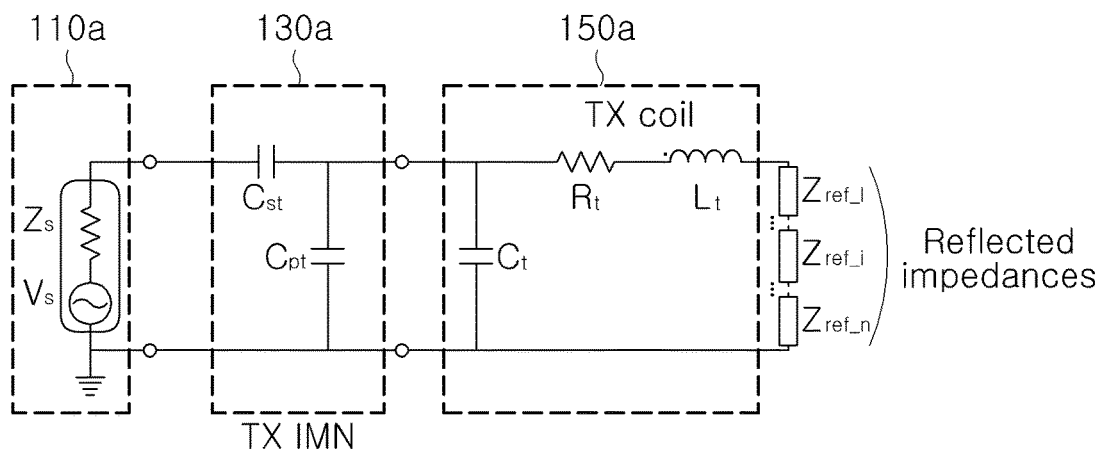
FIGS. 2A and 2B illustrate equivalent circuits based on a charging power supply device in a first embodiment of a battery charging system using wireless power transmission, according to the present invention.
Figure 2B:
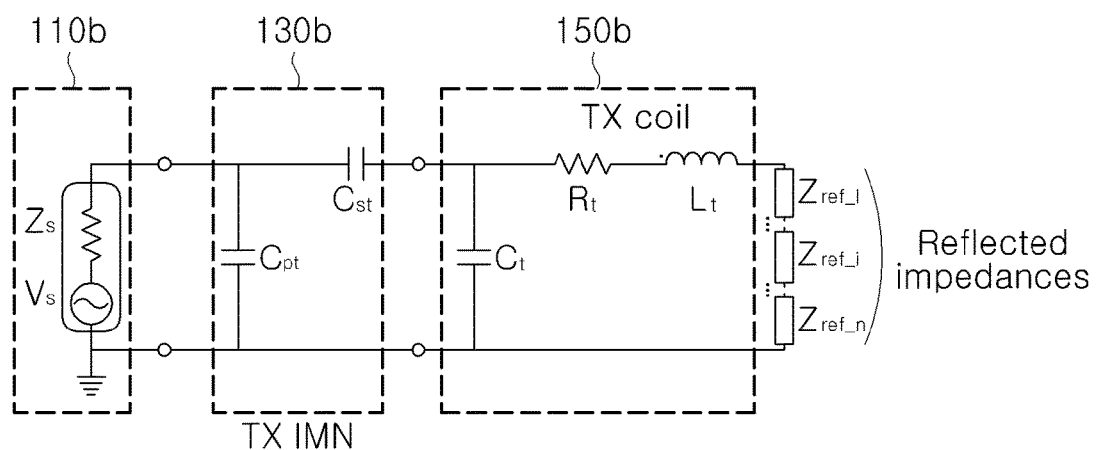

FIGS. 2A and 2B illustrate equivalent circuits based on the charging power supply device 100 in the first embodiment of the battery charging system of FIG. 1 using wireless power transmission, according to the present invention.

In power supply units 110a and 110b, Vs represents an AC signal generator having a specific frequency, $Z_s$ represents a characteristic impedance of the AC signal generator (including a signal amplifier), and Tx IMN represents an Impedance matching network. In the power transmission unit 150, $C_t$, $R_t$, and $L_t$ represent a self-capacitance, a loss resistance, and a self-inductance of the power transmission coil, respectively. $Z_{ref\_i}$ represents an equivalent reflected impedance of a configuration corresponding to a plurality of batteries in the battery charging device 200.

In the charging power supply device 100 illustrated in FIGS. 2A and 2B, transmission impedance matching units 130a and 130b include only capacitive elements. FIG. 2A illustrates a series-parallel (SP) series in which capacitors are connected in series ($C_{st}$) and parallel ($C_{pt}$). The power supply unit 110a and the first transmission capacitor $C_{st}$ are connected in series, and the second transmission capacitor $C_{pt}$ is connected in parallel to the serial connection of the power supply unit 110a and the first transmission capacitor $C_{st}$. FIG. 2B illustrates a parallel-series (PS) type in which capacitors are connected in parallel ($C_{pt}$) and series ($C_{st}$). The power supply unit 110b and the first transmission capacitor $C_{pt}$ are connected in parallel, and the second transmission capacitor $C_{st}$ is connected in series to the parallel connection of the power supply unit 110b and the first transmission capacitor $C_{pt}$.

Initially, $C_{pt}$ and $C_{st}$ are optimally matched to an arbitrary load of the reception unit. However, when the mutual inductance between the transmission/reception coils is changed or the load of the reception unit is changed, the values of $C_{pt}$ and $C_{st}$ may be changed for maximum power transmission from the transmission unit to the reception unit. For example, $C_{pt}$ may include a plurality of capacitors connected in parallel. The parallel-connected capacitors may be connected to a switch connected to a control unit for power transmission control. An appropriate capacitance value may be obtained by controlling the switch according to a change in the mutual capacitance and the reception load.

As described above, according to the present invention, the transmission impedance matching unit 130 of the charging power supply device 100 may be configured as the SP type or the PS type according to the situation while being configured only by the capacitors.

Figure 3A:
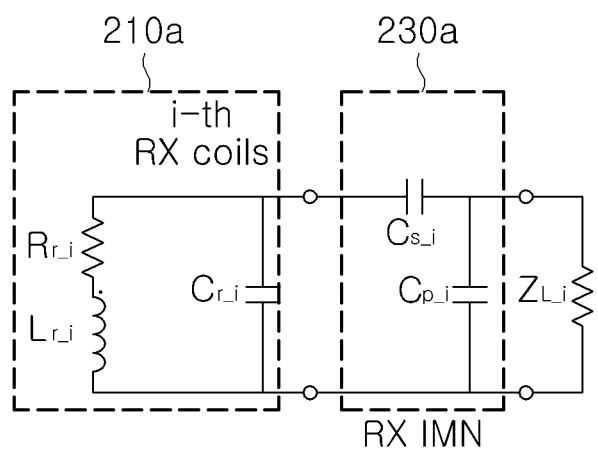
FIGS. 3A and 3B illustrate equivalent circuits based on a configuration corresponding to an $i^{th}$ battery of a battery charging device in the first embodiment of the battery charging system of FIG. 1 using wireless power transmission, according to the present invention.
Figure 3B:
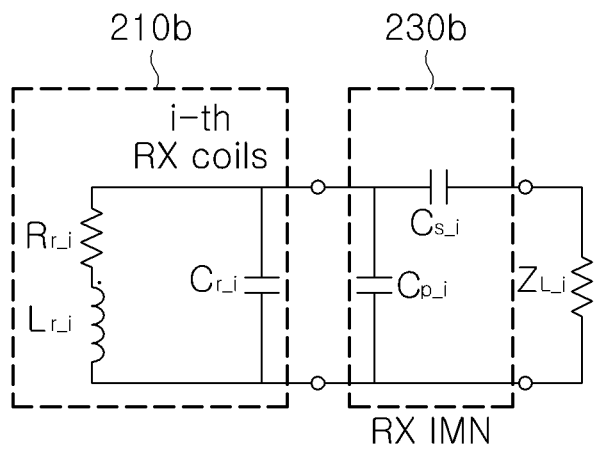

FIGS. 3A and 3B illustrate equivalent circuits based on a configuration corresponding to an $i^{th}$ battery of the battery charging device 200 in the first embodiment of the battery charging system of FIG. 1 using wireless power transmission, according to the present invention.

In the power reception units 210a and 210b, $R_{r\_i}$ and $L_{r\_i}$ represent a loss resistance and a self-inductance of the power reception coil, respectively, and $C_{r\_i}$ represents a self-capacitor of the reception coil.

In the reception impedance matching units 230a and 230b, Rx IMN represents an impedance matching network and may be configured only by capacitive elements as in FIGS. 2A and 2B. FIG. 3A illustrates an SP type in which capacitors are connected in series ($C_{s\_i}$) and parallel ($C_{p\_i}$). The power reception unit 210a and the first reception capacitor $C_{s\_i}$ are connected in series, and the second reception capacitor $C_{p\_i}$ is connected in parallel to the series connection of the power reception unit 210a and the first reception capacitor $C_{s\_i}$. FIG. 3B illustrates a PS type in which capacitors are connected in parallel ($C_{p\_i}$) and series ($C_{s\_i}$). The power reception unit 210b and the first reception capacitor $C_{p\_i}$ are connected in parallel, and the second reception capacitor $C_{s\_i}$ is connected in series to the parallel connection of the power reception unit 210b and the first reception capacitor $C_{p\_i}$.

At this time, the self-capacitances $C_{r\_i}$ of the power reception units 210a and 210b is generally smaller than those of the capacitors used in the Rx IMN of the reception impedance matching units 230a and 230b.

Like the impedance matching unit of the transmission unit, $C_{s\_i}$ and $C_{p\_i}$ are initially matched to the arbitrary mutual inductance value between the transmission/reception units and the impedance of the load. However, in actual charging, the impedances of the individual reception loads are varied and the optimal value has to be changed when the mutual inductance is changed.

Since the reception impedance matching units 230a and 230b are characteristic in FIGS. 3A and 3B, the battery charging unit 250 and the corresponding battery 10 are illustrated as a load $Z_{L\_i}$. The configuration of the battery charging unit 250 is omitted.

As described above, according to the present invention, the reception impedance matching unit 230 of the battery charging device 200 may be configured as the SP type or the PS type according to the situation while being configured only by the capacitors, and the SP type or the PS type of the transmission impedance matching unit 130 of the charging power supply device 100 can be selectively and simultaneously considered according to the situation.

Furthermore, according to the present invention, the charging power supply device and the battery charging device may be modified in various forms. In particular, in a case where two or more batteries are simultaneously charged, appropriate impedance matching may not be achieved if the transmission impedance matching units 130a and 130b and the reception impedance matching units 230a and 230b are configured only by the capacitors. For example, when a imaginary part of the impedance when looking at the transmission coil from the power transmission unit has a negative value or when an imaginary part of the impedance when looking at the power reception unit from the reception impedance matching unit has a negative value, the transmission impedance matching units 130a and 130b and the reception impedance matching units 230a and 230b have to be configured by the combination of the capacitors and the inductors.

In addition, a lumped element or a distributed element may be used as the inductor for the impedance matching, and a mutual inductance between a plurality of coils may also be used.

Therefore, according to the present invention, the inductance element may be added to the transmission impedance matching unit and the reception impedance matching unit so that a more appropriate impedance matching can be performed in the charging power supply device and the battery charging device, and details thereof will be described through the following embodiment.

Figure 4:
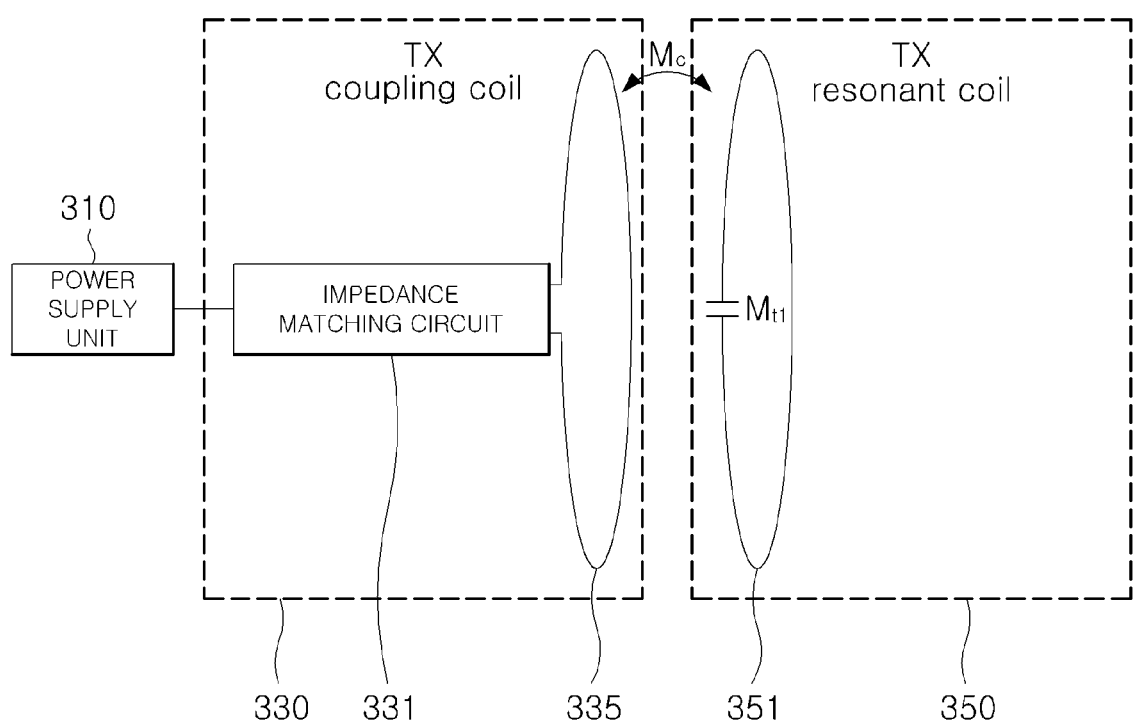
FIG. 4 illustrates a configuration of a charging power supply device in a second embodiment of the battery charging system using wireless power transmission, according to the present invention.

FIG. 4 illustrates a configuration of a charging power supply device in a second embodiment of the battery charging system using wireless power transmission, according to the present invention.

In the charging power supply device 300 illustrated in FIG. 4, a transmission coupling coil 335 is added to a transmission impedance matching unit 330, and a power transmission coil of a power transmission unit 350 is configured by a transmission self-resonant coil 351.

The transmission coupling coil 335 and the transmission self-resonant coil 351 are physically separated and may be implemented on the same plane. The transmission coupling coil 335 connected to an impedance matching circuit 331 transmits power to the transmission self-resonant coil 351 through magnetic coupling. Here, $M_c$ represents a mutual inductance between the transmission coupling coil 335 and the transmission self-resonant coil 351. When the mutual inductance is changed, the total impedance when looking at the transmission coupling coil from the impedance matching circuit is changed, and the impedance matching between the power supply unit and the transmission self-resonant coil may be performed.

In this way, the impedance matching may be performed by adjusting the mutual inductance Mc between the transmission coupling coil 335 and the transmission self-resonant coil 351. To this end, the size of the transmission coupling coil 335 may be adjusted, the number of turns may be adjusted, or the spacing between the transmission coupling coil 335 and the transmission self-resonant coil 351 may be adjusted.

Further, the power transmission unit 350 may include a third transmission capacitor $C_{t1}$ for adjusting a resonant frequency, and the third transmission capacitor $C_{t1}$ may be connected to the transmission self-resonant coil 351.

Figure 5A:
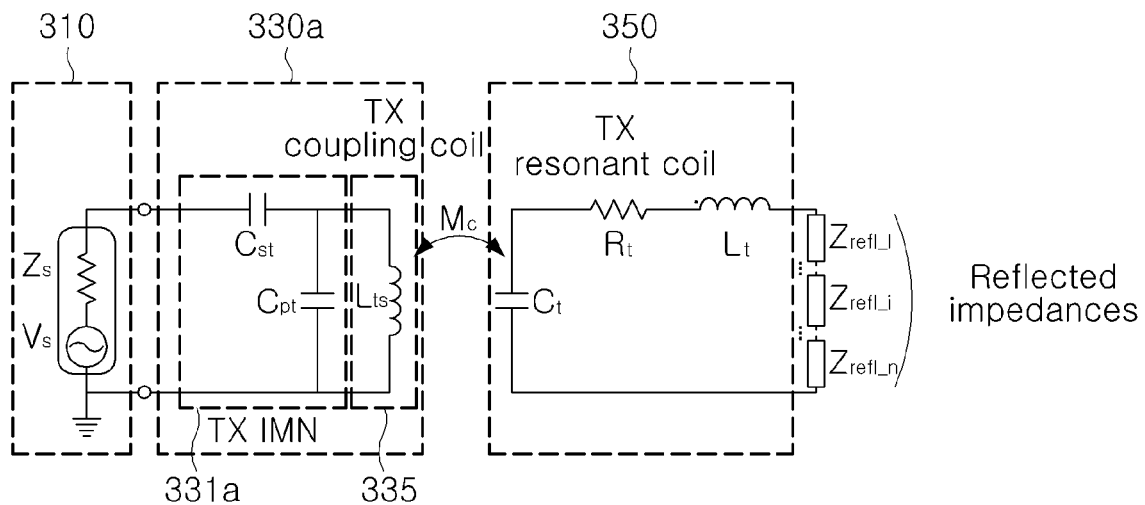
FIGS. 5A and 5B illustrate equivalent circuits of a modified configuration of the charging power supply device in the second embodiment of the battery charging system using wireless power transmission, according to the present invention.
Figure 5B:
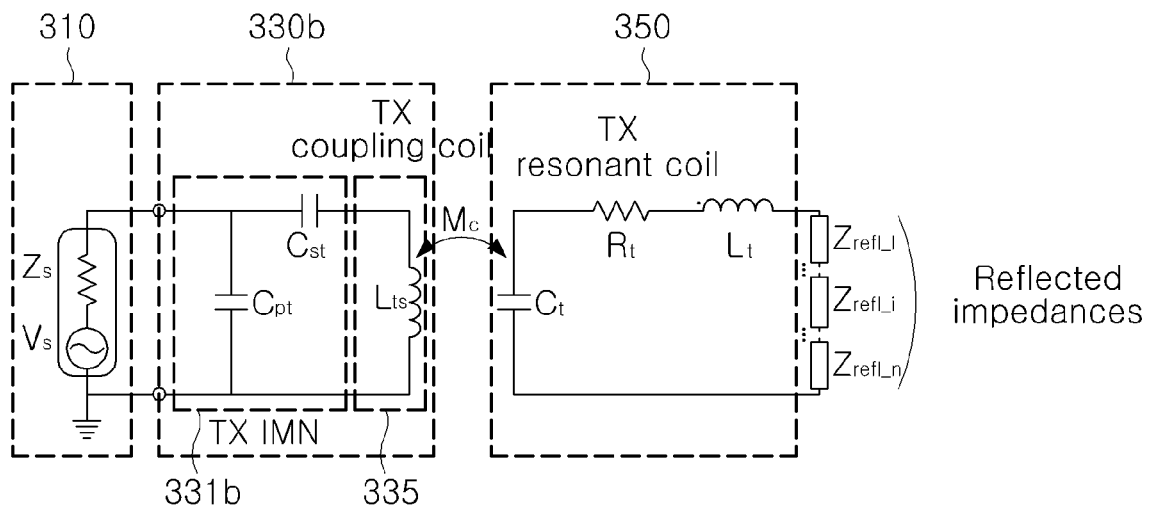

Further, the impedance matching circuit 331, to which the transmission coupling coil 335 is connected in the transmission impedance matching unit 330, may be configured by a simple series capacitance for impedance matching, but it is preferable that he SP type or the PS type of the Tx IMN may be selectively configured in FIGS. 2A and 3B so as to perform the impedance matching more effectively and appropriately. FIGS. 5A and 5B illustrate equivalent circuits of a modified configuration of the charging power supply device in the second embodiment of the battery charging system using wireless power transmission, according to the present invention.

In FIG. 5A, the SP-type Tx IMN 331a is configured in the transmission impedance matching unit 330a. The SP-type Tx IMN 331a has the same configuration as illustrated in FIG. 2A. The transmission coupling coil 335a is connected to an output terminal of the SP-type Tx IMN 331a, and the transmission coupling coil 335a may perform the impedance matching with the mutual inductance $M_c$ between the transmission coupling coil 335a and the transmission self-resonant coil while transmitting power to the transmission self-resonant coil of the power transmission unit 350 through magnetic coupling.

In FIG. 5B, the PS-type Tx IMN 331b is configured in the transmission impedance matching unit 330b. The PS-type Tx IMN 331b has the same configuration as illustrated in FIG. 2B, and a transmission coupling coil 335b is connected to an output terminal of the PS-type Tx IMN 331b. Like in FIG. 5A, the transmission coupling coil 335b may perform the impedance matching with the mutual inductance $M_c$ between the transmission coupling coil 335b and the transmission self-resonant coil while transmitting power to the transmission self-resonant coil of the power transmission unit 350 through magnetic coupling.

Figure 6:
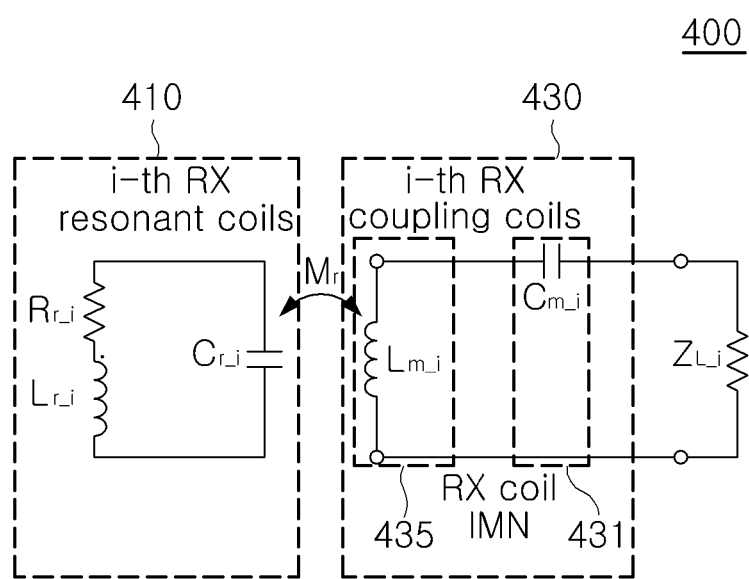
FIG. 6 illustrates an equivalent circuit based on a configuration corresponding to an $i^{th}$ battery of a battery charging device in the second embodiment of the battery charging system using wireless power transmission, according to the present invention.

Next, FIG. 6 illustrates an equivalent circuit based on a configuration corresponding to an $i^{th}$ battery of a battery charging device in the second embodiment of the battery charging system using wireless power transmission, according to the present invention.

In the battery charging device 400 illustrated in FIG. 6, a reception coupling coil is additionally introduced to the reception impedance matching unit 430, and a power reception coil of the power reception unit 410 is configured by a reception self-resonant coil.

$L_{m\_i}$ represents a magnetic inductance of an $i^{th}$ reception coupling coil, $M_r$ represents a mutual inductance between a reception self-resonant coil and a reception coupling coil, and $C_{m\_i}$ represents a series capacitor for impedance matching.

Similarly, as described with reference to FIGS. 5A and 5B, the reception coupling coil and the reception self-resonant coil are physically separated and may be implemented on the same plane. The reception coupling coil may perform impedance matching by adjusting the inductance $M_r$ transmitting power to the reception self-resonant coil through magnetic coupling. To this end, the size of the reception coupling coil may be adjusted, the number of turns may be adjusted, or the spacing between the reception coupling coil and the reception self-resonant coil may be adjusted.

The power transmission through the magnetic coupling between the reception coupling coil and the reception self-resonant coil and the impedance matching according to the mutual inductance are similar to those described with reference to FIGS. 5A and 5B.

Furthermore, as in FIG. 6, a reception capacitor may be configured in the reception impedance matching unit 430 as a simple series capacitance $C_{m\_i}$ connected to the reception coupling coil for impedance matching. However, it is preferable the SP type or the PS type of the Rx IMN selectively replaces the reception capacitor $C_{m\_i}$ in FIGS. 3A and 3B for a more effective and appropriate impedance matching. That is, the reception impedance matching unit 430 may be configured by connecting the SP-type or PS-type Rx IMN to the reception coupling coil. As described above, the transmission impedance matching unit and the reception impedance matching unit in the charging power supply device according to the present invention additionally employ the capacitance component of the impedance matching circuit and the transmission coupling coil or the reception coupling coil, and simultaneously use the mutual inductance component between the transmission coupling coil and the transmission self-resonant coil or the mutual inductance component between the reception coupling coil and the reception self-resonant coil, thereby implementing a wireless charging system for a plurality of loads or individual batteries.

Preferably, the transmission impedance matching unit of FIGS. 5A, 5B and the reception impedance matching unit of FIG. 6 may be configured at the same time, but if necessary, only one of them may be selectively combined and configured.

Furthermore, in a case where a large number of batteries require simultaneous charging, wireless power transmission needs to be performed in a wider area. When wireless power transmission is performed over a wide area, the charging power supply device according to the present invention may include a plurality of power transmission coils so that wireless charging is effectively performed for each battery. Details thereof will be described below.

Figure 7:
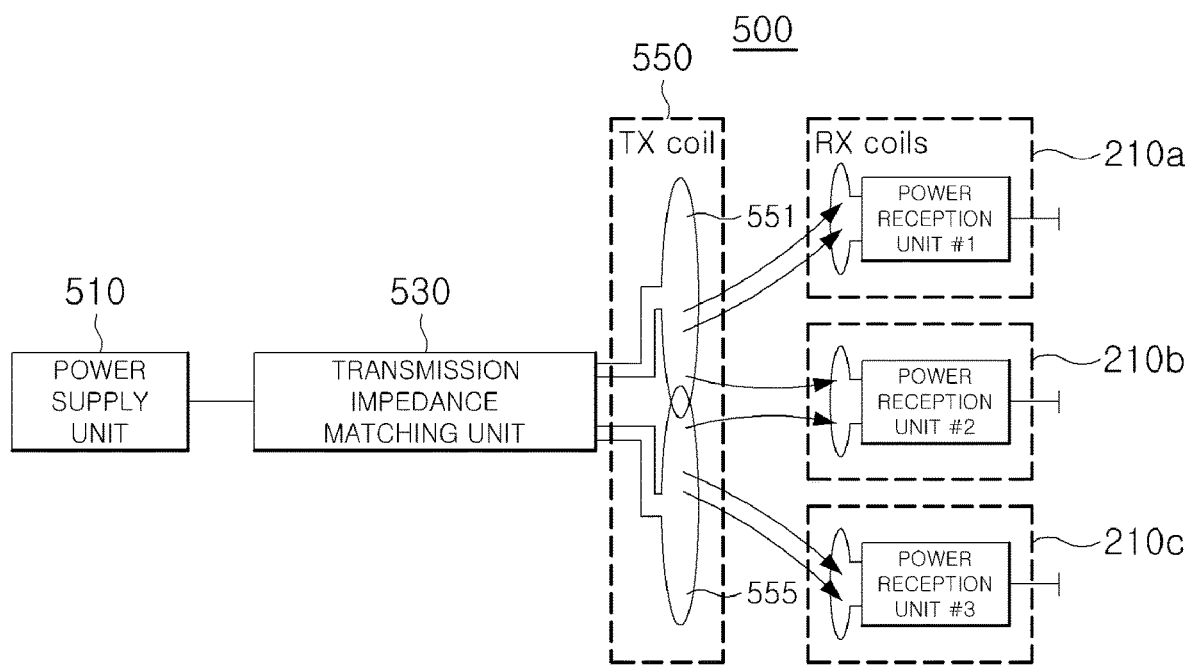
FIG. 7 illustrates a third embodiment of a battery charging system using wireless power transmission, according to the present invention.

FIG. 7 illustrates a third embodiment of a battery charging system using wireless power transmission, according to the present invention.

In the third embodiment of FIG. 7, two power transmission coils 551 and 555 are employed in a power transmission unit 550 of a charging power supply device 500, and more power transmission coils may be provided according to a situation.

When a plurality of power transmission coils 551 and 555 are provided for wireless power transmission, smooth power transmission may be achieved for each of a plurality of power reception units 210a, 210b, and 210b. Further, a region where the plurality of power transmission coils 551 and 555 wirelessly transmit power may be divided. That is, as illustrated in FIG. 7, the first power transmission coil 551 may transmit power to the first power reception unit 210a and the second power reception unit 210b, and the second power transmission coil 555 may transmit power to the second power reception unit 210b and the third power reception unit 210c. In particular, in the case of the second power reception unit 210b positioned at the outer periphery with respect to the power transmission coils 551 and 555, the power transmitted from the first power transmission coil 551 is relatively weak because the second power reception unit 210b is positioned at the outer periphery as compared with the first power transmission coil 551. However, as the power is transmitted from the second power transmission coil 555 as well as the first power transmission coil 555, relatively weak transmission powers are added to provide sufficient charging power.

Furthermore, in the third embodiment of FIG. 7, the plurality of power transmission coils 551 and 555 are all connected to one transmission impedance matching unit 530. If necessary, a transmission impedance matching unit may be individually configured for each of the power transmission coils 551 and 555, and a power supply unit may also be separately configured.

Figure 8:
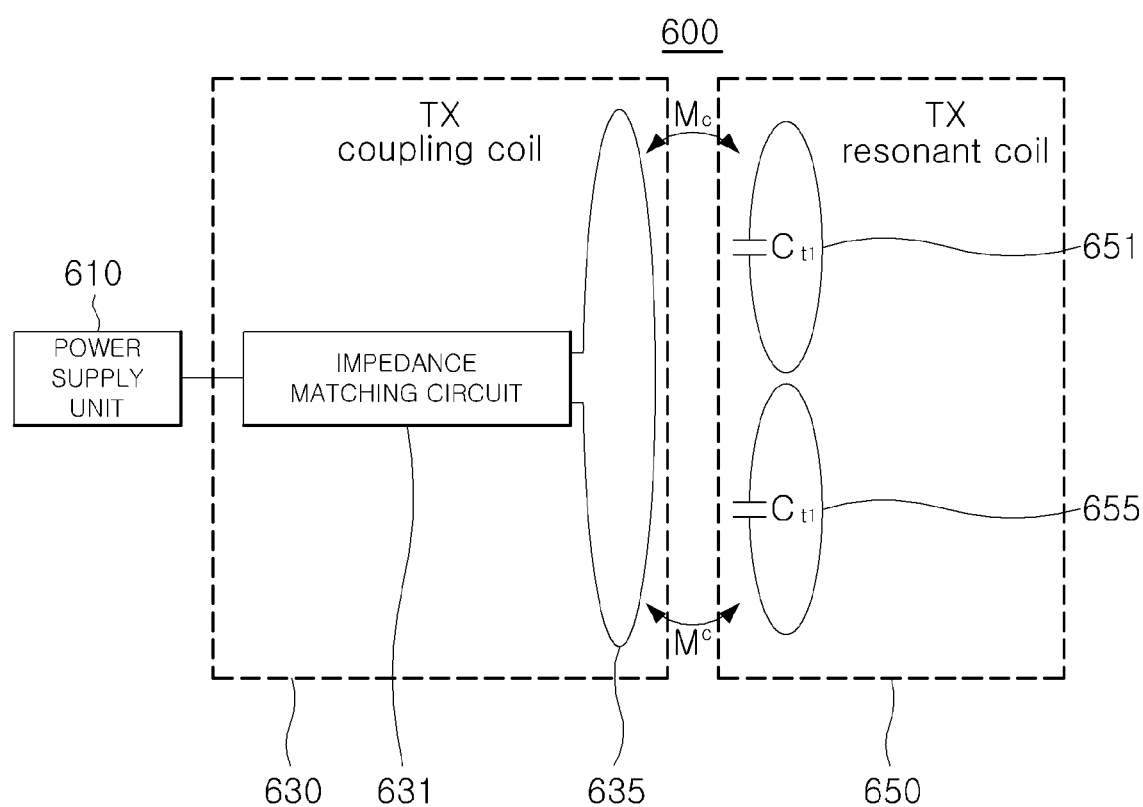
FIG. 8 illustrates a modified configuration of a charging power supply device in which the second embodiment and the third embodiment of the battery charging system using wireless power transmission according to the present invention are combined.

Furthermore, the transmission coupling coil described above may be configured so as to provide a more appropriate impedance matching in the third embodiment of FIG. 7. FIG. 8 illustrates a modified configuration of a charging power supply device in which the second embodiment and the third embodiment of the battery charging system using wireless power transmission according to the present invention are combined.

Referring to FIG. 8, a transmission impedance matching unit 630 of a charging power supply device 600 includes a transmission coupling coil 635, and may perform impedance matching by adjusting a mutual inductance $M_c$ while transmitting power to a plurality of transmission self-resonant coils 651 and 655 through magnetic coupling to a transmission coupling coil connected to an impedance matching circuit 631 by applying the transmission self-resonant coils 651 and 655 as a plurality of power transmission coils.

Here, the transmission self-resonant coils 651 and 655 are configured in plurality, but the transmission coupling coil 635 is configured by one coil, so that power transmission and impedance matching for each of the transmission self-resonant coils 651 and 655 may be performed through one transmission coupling coil 635.

In addition, the power transmission unit 650 may include third transmission capacitors $C_{t1}$ and $C_{t2}$ for adjusting the resonance frequencies in the transmission self-resonant coils 651 and 655, respectively.

Figure 9A:
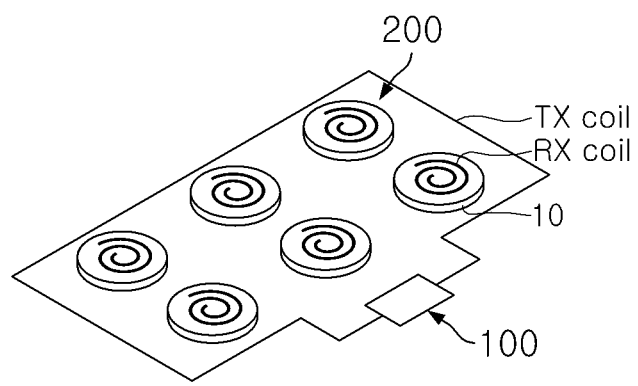
FIGS. 9A, 9B and 9C illustrate implementation examples of the first to third embodiments of the battery charging system using wireless power transmission, according to the present invention.
Figure 9B:
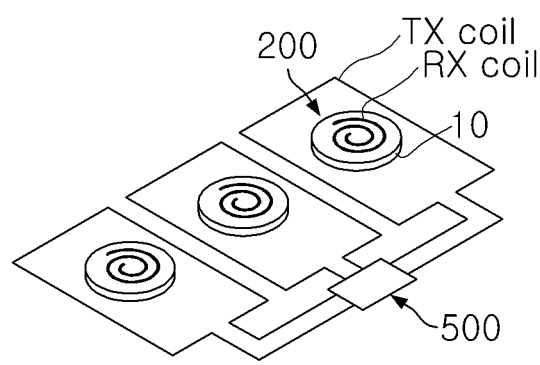
Figure 9C:
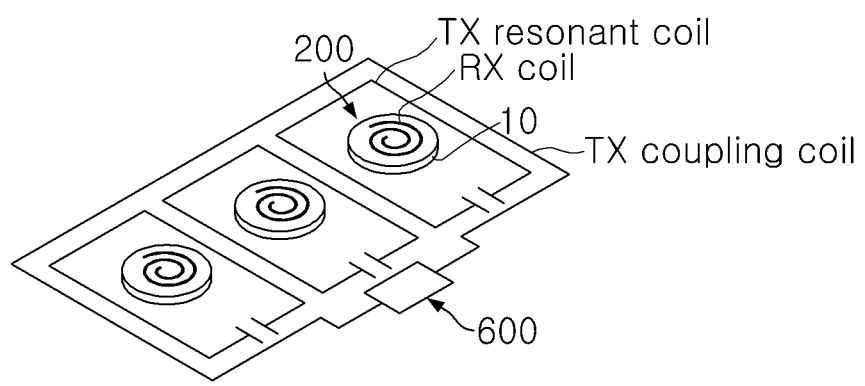

FIGS. 9A, 9B and 9C illustrate implementation examples of each embodiment of the battery charging system using wireless power transmission, according to the present invention.

FIG. 9A is an implementation example in which the charging power supply device 100 of FIGS. 1, 2A and 2B according to the first embodiment is applied such that power is wirelessly transmitted to a power reception coil (Rx coil) of a power reception unit 210 of a battery charging device 200 provided for each of a plurality of batteries 10 from the power transmission unit 150 to one power transmission coil (Tx coil), thereby simultaneously charging the plurality of batteries.

FIG. 9B is an implementation example in which the charging power supply device 500 of FIG. 7 according to the third embodiment is applied such that power is wirelessly transmitted to a power reception coil (Rx coil) of a power reception unit 210 of a battery charging device provided for each of a plurality of batteries 10 from the power transmission unit 550 to a plurality of power transmission coils (Tx coils), thereby simultaneously charging the plurality of batteries.

FIG. 9C is an implementation example in which the charging power supply device 600 of FIG. 8, in which the second embodiment and the third embodiment are combined, is applied such that a transmission coupling coil (Tx coupling coil) and a transmission self-resonant coil (Tx self-resonant coil) are configured to wirelessly transmit power to a power reception coil (Rx coil) of a power reception unit 210 of a battery charging device 200 provided for each of a plurality of batteries 10, thereby simultaneously charging the plurality of batteries 10.

The battery charging device 200 illustrated in FIGS. 9A, 9B and 9C may be modified by applying various embodiments described above.

The battery charging system using wireless power transmission according to the present invention can wirelessly charge the plurality of batteries at the same time. In order for more effective battery charging, it is necessary to consider the charging amount required for each of the plurality of batteries. In addition, it is necessary to perform charging by taking into account characteristics of each rechargeable battery mounted on different electronic devices. To this end, the present invention provides the configuration for controlling the charging state, which will be described below with reference to embodiments.

Figure 10:
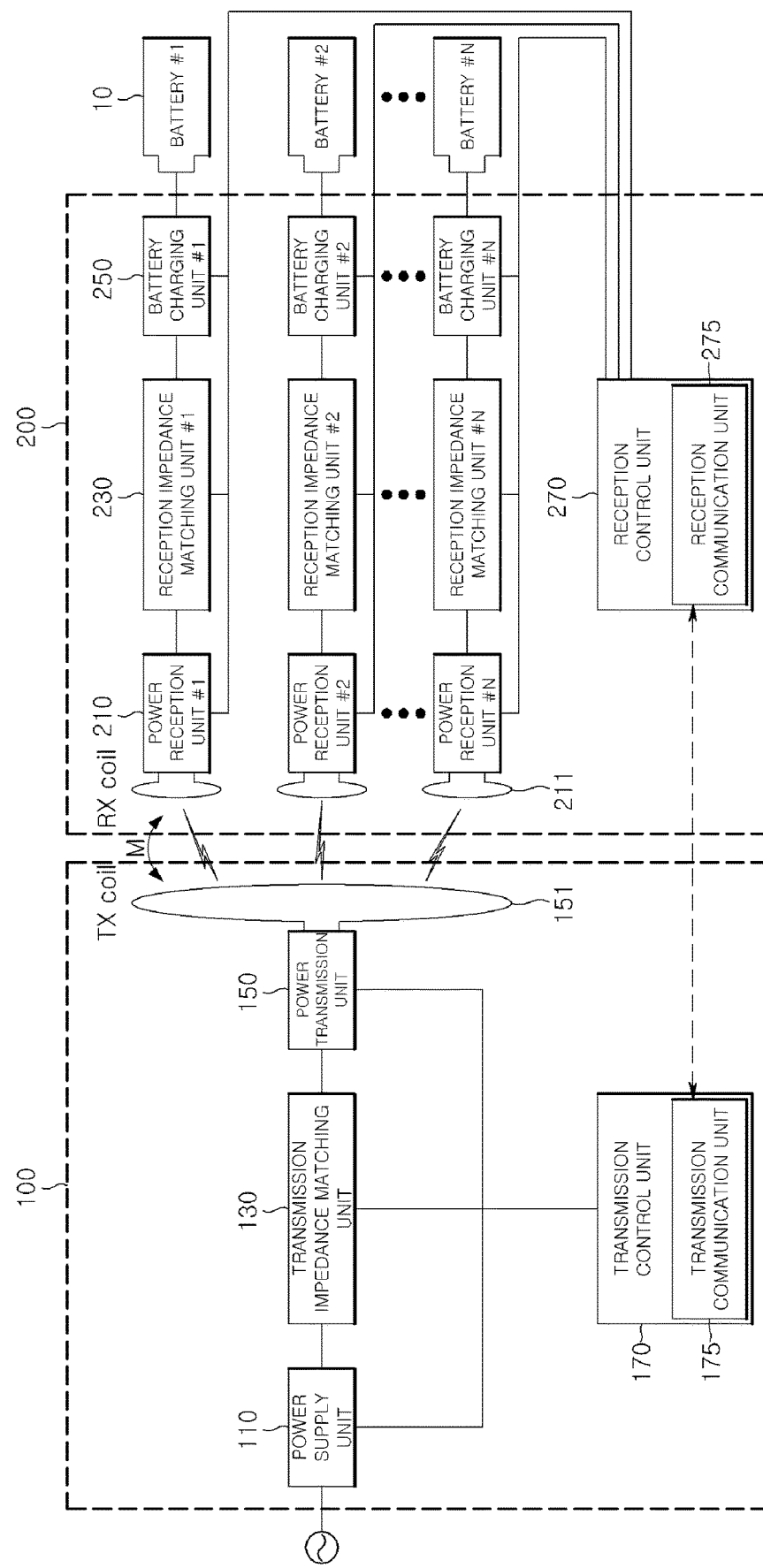
FIG. 10 is a configuration diagram of a fourth embodiment of a plurality of battery charging systems using wireless power transmission, according to the present invention.

FIG. 10 is a configuration diagram of a fourth embodiment of a battery charging system using wireless power transmission, according to the present invention.

Since a basic configuration of FIG. 10 is the same as or similar to that of the first embodiment of FIG. 1, a redundant description thereof will be omitted.

In the fourth embodiment of FIG. 10, a battery charging device 200 includes a reception control unit 270 for controlling a charging state of each battery 10, and the reception control unit 270 includes a reception communication unit 275 for performing communication with a charging power supply device 100.

A battery charging unit 250 of the battery charging device 200 not only supplies the charging power to the battery 10 but also checks a remaining charging amount of the battery 10 and performs charging of the battery 10 or stops charging the battery 10.

Information on the remaining charging amount of the battery 10 in the battery charging unit 250 may be transmitted to the reception control unit 270, and the reception control unit 270 may generate charging state information for each or all of the plurality of batteries 10 based on the received information and control the battery charging unit 250 based on the charging state information, so as to control the charging of each battery 10.

Preferably, a transmission control unit 170 is provided in the charging power supply device 100 so as to adjust and control the charging power that is wirelessly transmitted. The transmission control unit 170 may include a transmission communication unit 175 capable of performing wired or wireless communication with the reception communication unit 275 of the reception control unit 270, so that the charging power supply device 100 and the battery charging device 200 interwork with each other to effectively perform charging based on the charging state information.

As an example, the reception control unit 270 controls the battery charging unit 250 to charge the unit battery up to a predetermined charging upper limit voltage. That is, the reception control unit 270 may check the voltage of the unit battery while the unit battery is charged, and may control the battery charging unit 250 to stop charging the unit battery when the voltage of the unit battery reaches the charging upper limit voltage (or unique charging capacity). At this time, while the battery charging unit 250 stops charging the unit battery or while the power reception unit 210 of the battery charging device 200 does not receive the wireless power transmitted from the charging power supply device 100, the reception control unit 270 may perform control so that each component of the battery charging device 200 corresponding to the battery does not act as the load of the unit battery. That is, the battery charging unit 250 includes a circuit that supplies power only to the unit cell, and should not act as the load caused by the power of the unit cell. To this end, the reception control unit 270 may turn off a predetermined switch of the battery charging unit 250 while the battery charging unit 250 does not supply power to the unit battery, so as to control the current flow to be blocked so that no current flows from the unit battery to the battery charging unit 250.

Figure 11:
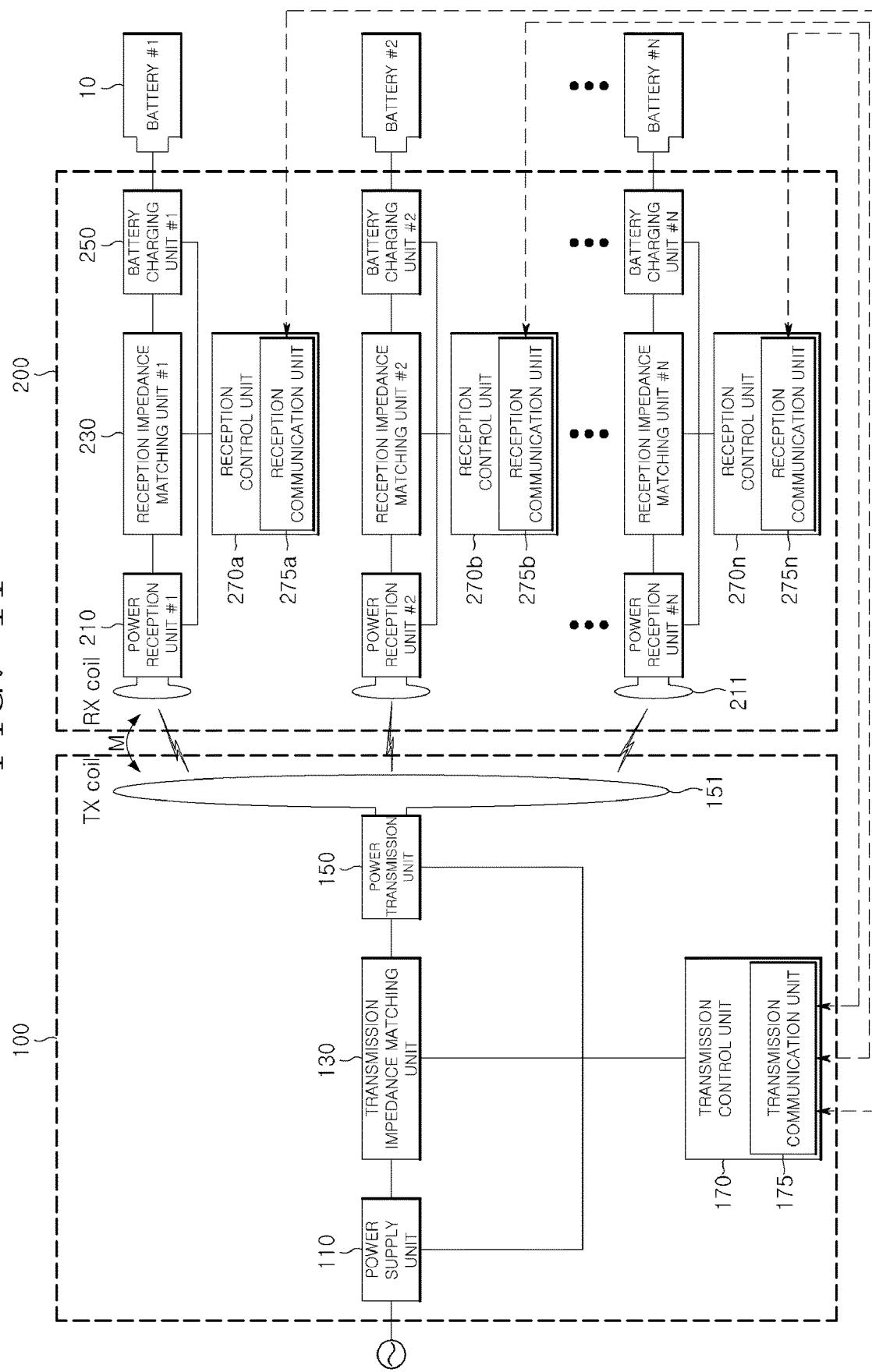
FIG. 11 is a modified configuration diagram of the fourth embodiment of the battery charging system using wireless power transmission, according to the present invention.

FIG. 11 is a modified configuration diagram of the fourth embodiment of the battery charging system using wireless power transmission, according to the present invention.

In FIG. 10, the single reception control unit 270 is configured to collectively manage and control the configuration of the battery charging unit 250 and the like corresponding to the plurality of batteries. However, in order to simultaneously perform charging by more accurately taking into account charging characteristics of a plurality of different heterogeneous electronic devices, reception control units 270a, 270b, . . . 270n are individually configured for each configuration of the battery charging unit 250 and the like corresponding to each battery 10 in FIG. 11. Reception communication units 275a, 275b, . . . 275n of the reception control units 270a, 270b, . . . 270n are configured to individually transmit the charging state information of the battery 10 to the reception control units 270a, 270b, . . . 270n, respectively.

In the fourth embodiment of FIGS. 10 and 11, the transmission control unit 170 of the charging power supply device 100 adjusts and controls the charging power to be wirelessly transmitted according to a real-time charging situation, and the reception control unit 270 (270a, 270b, . . . , 270n) of the battery charging device 200 may control the battery charging unit 250 to manage the charging operation of the battery 10.

The present invention is not limited to the above-described battery charging system, and may also be implemented as a wireless power transmission device and a wireless power reception device for wireless power transmission. More specifically, the wireless power transmission device according to an embodiment of the present invention is a wireless power transmission device capable of wirelessly transmitting power to one or more wireless power reception devices in a wireless power transmission system and may include: a power transmission unit that includes at least one power transmission coil and transmits power to the wireless power reception device; a power supply unit that supplies power to the power transmission unit; and a transmission impedance matching unit that matches an impedance between the power supply unit and the power transmission unit. At this time, the wireless power reception device receives power wirelessly transmitted from the charging power supply device through a power reception coil individually provided for each wireless power reception device.

In addition, a wireless power reception device according to another embodiment of the present invention is a wireless power reception device that receives power from the wireless power transmission device capable of wirelessly transmitting power simultaneously to one or more wireless power reception devices and may include: a power reception unit that includes a power reception coil for receiving power wirelessly transmitted from the charging power supply device; a module power supply unit that supplies power received from the power reception unit to another module; and a reception impedance matching unit that performs impedance matching between the power reception unit and the module power supply unit.

Furthermore, the wireless power transmission device and the wireless power reception device according to the embodiment of the present invention may be implemented in various embodiments by adding the configurations similar to those of the above-described battery charging systems.

For example, the reception impedance matching unit may include at least one reception capacitor and a reception self-resonant coil that transmits the received power to the reception impedance matching unit through magnetic coupling to the power reception coil. At this time, the mutual inductance between the inductance caused by the reception coupling coil and the reception resonant coil may be adjusted to contribute to impedance matching.

In addition, the wireless power reception device according to an embodiment of the present invention may further include a control unit that controls the impedance matching of the reception impedance matching unit to control power supplied to the module power supply unit. Similarly, the wireless power supply device may further include a control unit that controls the impedance matching of the transmission impedance matching unit.

In this case, in the wireless power reception device according to an embodiment of the present invention, the control unit may control the impedance matching of the reception impedance matching unit by taking into account the state of the module measured by the module power supply unit.

Therefore, the wireless power transmission device and the wireless power reception device according to an embodiment of the present invention may adjust the impedance matching by taking into account the power supplied to the module, so as to appropriately control power wirelessly transmitted to each wireless power reception device and distributed to each module.

Hereinafter, test results of the implementation of the battery charging system using wireless power transmission according to the present invention will be described.

Figure 12:
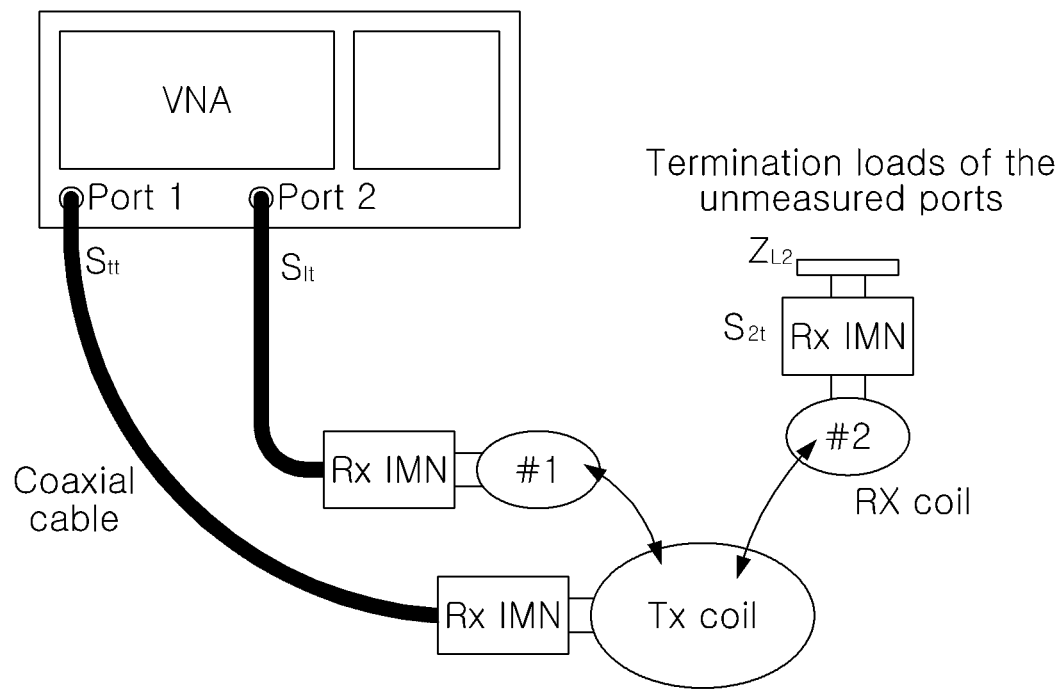
FIG. 12 illustrates an implementation example for testing the battery charging system using wireless power transmission, according to the present invention.

FIG. 12 is a configuration diagram of a battery charging system using wireless power transmission according to the present invention in a case where one power transmission coil is used in a power transmission unit of a charging power supply device, a power reception unit of a battery charging device is configured by a first power reception unit and a second power reception unit, and two power reception coils are used.

A vector network analyzer (VNA) was used to measure the operation of the battery charging system illustrated in FIG. 12. Tx IMN was applied to a transmission impedance matching unit of the charging power supply device, Rx IMN was applied to a reception impedance matching unit of the battery charging device, and an SP type and a PS type were combined to perform a test. The VNA is a 2-port meter, and the configuration of the battery charging device that was not measured for two reception measurements was set to measurement impedance $Z_{L2}$. In addition, a characteristic impedance of a VNA port is generally 50Ω.

Figure 13A:
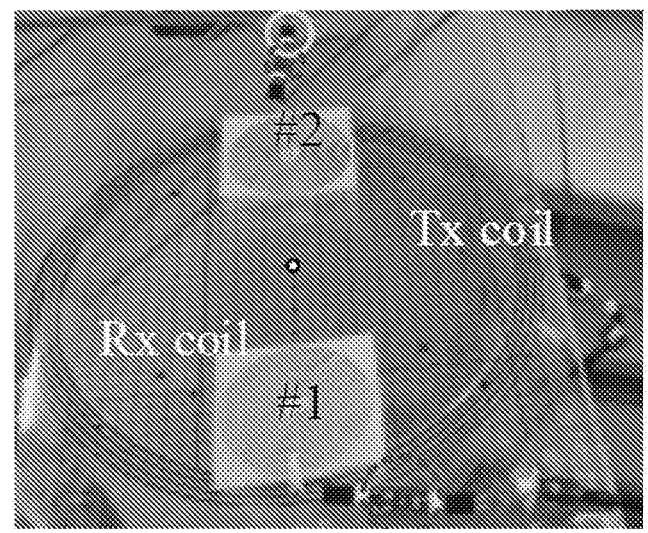
FIGS. 13A and 13B illustrate a power transmission coil, a power reception coil, and an impedance matching circuit manufactured according to FIGS. 1, 2A, 2B, 3A, and 3B.
Figure 13B:
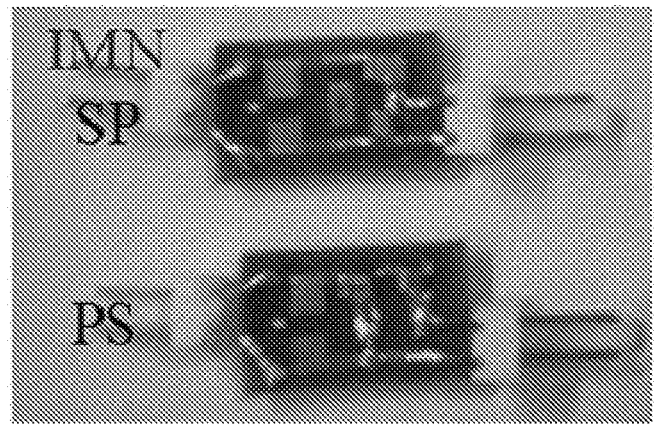

FIGS. 13A and 13B illustrat a power transmission coil, a power reception coil, and an impedance matching circuit with respect to the battery charging system using wireless power transmission according to the present invention. Here, a four-turn spiral coil is used as the power transmission coil, a radius of the power transmission coil is 90 mm, and a distance between wires is 3 mm. The power reception coil is a ten-turn spiral coil and has a radius of 23.5 mm.

A capacitance used for impedance matching of the SP type and the PS type is shown in Table 1 below. An optimum capacitance is 50Ω for two loads $Z_{L1}$ and $Z_{L2}$.

TABLE 1

| | Optimum capacitance | | | | |
| --- | --- | --- | --- | --- | --- |
| | Tx | | | Rx | |
| | $C_{st}$ | $C_{pt}$ | | $C_{s\_i}$ | $C_{p\_i}$ |
| SP | 56.50 pF | 25.81 pF | SP | 297.78 pF | 659.15 pF |
| PS | 89.90 pF | 498.06 pF | PS | 136.60 pF | 97.15 pF |

Figure 14:
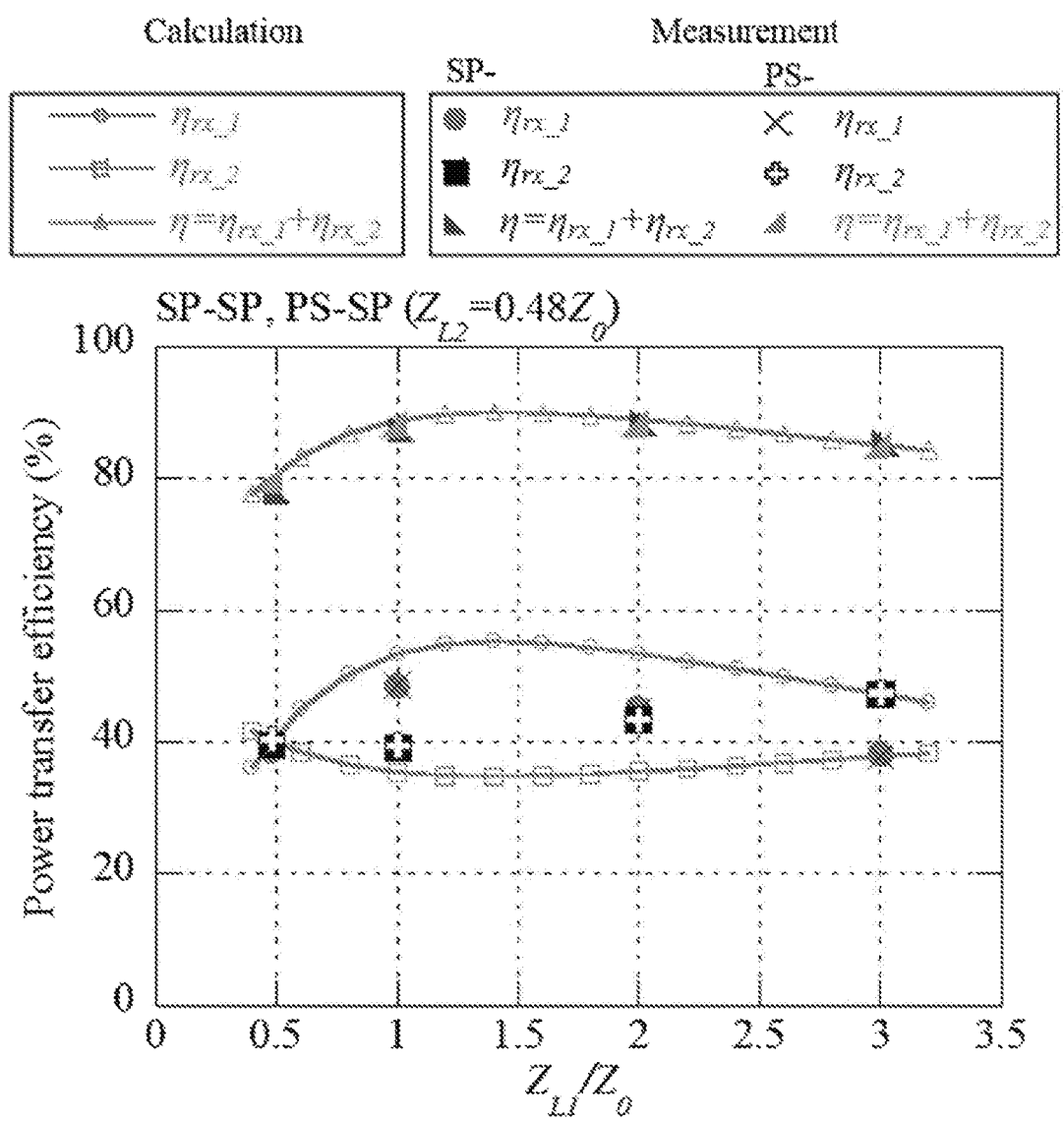
FIGS. 14 to 17 illustrate power transfer efficiency in a test performed in combination of a transmission impedance matching unit of a charging power supply device and a reception impedance matching unit of a battery charging device in FIGS. 12 and 13.

FIG. 14 shows the results for the combination of two impedance matching configurations. Here, SP-SP is a case where the SP type is applied to the transmission impedance matching unit of the charging power supply device and the SP type is applied to the reception impedance matching unit of the battery charging device, and PS-SP is a case where the PS type is applied to the transmission impedance matching unit of the charging power supply device and the SP type is applied to the reception impedance matching unit of the battery charging device.

FIG. 14 shows the power transfer efficiency with respect to $Z_{L1}/Z_0$. $Z_{L2}$ represents the load of the battery charging device. The value of $Z_{L2}$ is fixed to $0.48*Z_0$ and $Z_0$ is set to 50Ω.

In such setting conditions, the simulation calculation result is indicated by a solid line in FIG. 14, and the measurement results are values measured when $Z_{L1}/Z_0$ is 0.5, 1, 2, and 3. When this case is compared with an actual charging scenario, the transmission/reception load varies according to the charging state.

The efficiencies for the first and second power reception units of the battery charging device are represented by $\eta_{rx\_1}$ and $\eta_{rx\_2}$ and the total efficiency obtained by adding the efficiencies of the two loads is represented by $\eta$.

Figure 15:
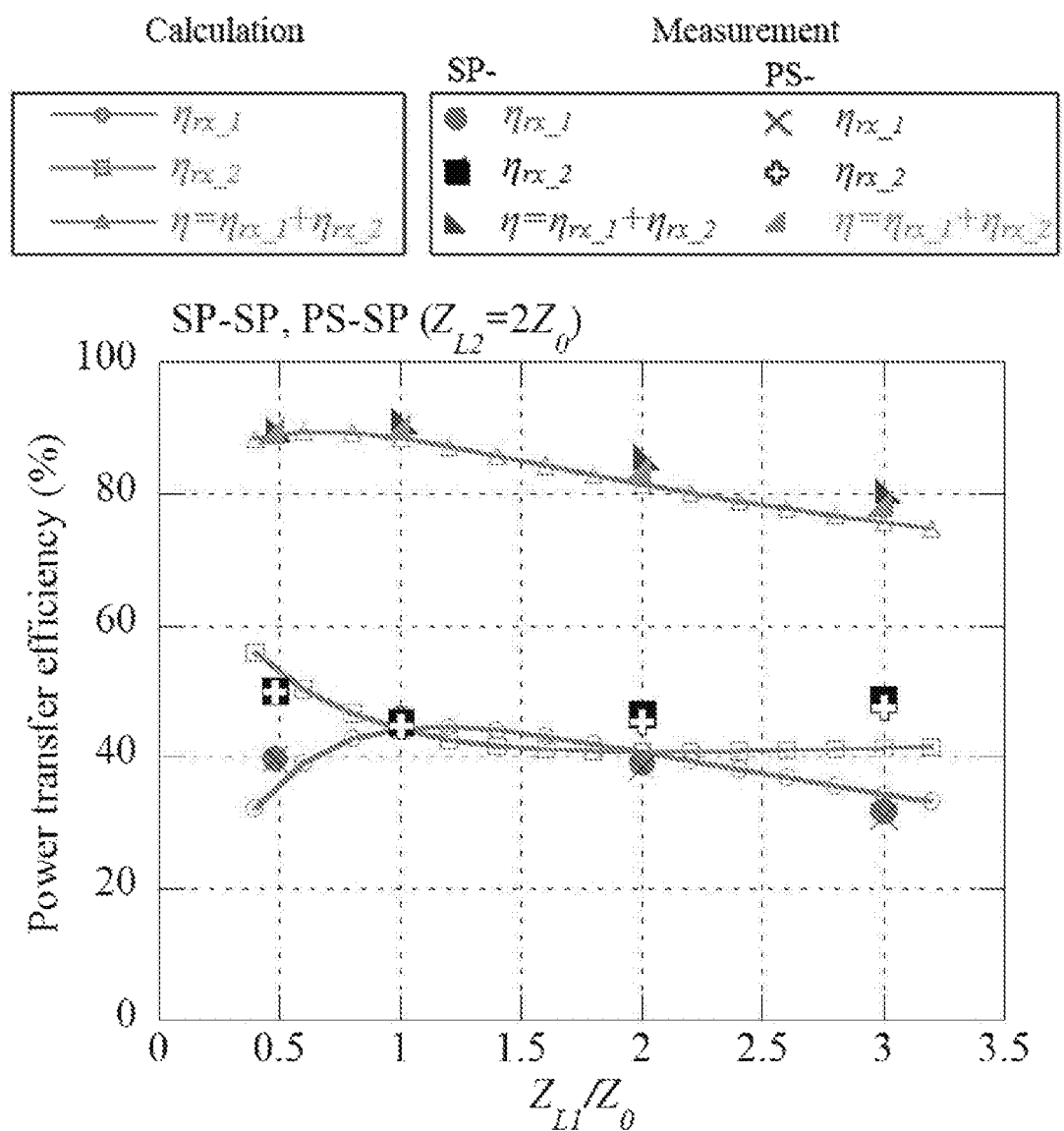

FIG. 15 shows the transfer efficiency of $Z_{L1}/Z_0$ for the case where $Z_{L2}$ is fixed to $2Z_0$ while the same configurations as that of FIGS. 13A and 13B are applied.

When determined from the results of FIGS. 14 and 15, the transmission impedance matching unit of the charging power supply device shows the same result values, regardless of the selection of the SP type and the PS type. It can also be seen that the efficiencies of the two loads are the same when $Z_{L1}$ and $Z_{L2}$ are the same. However, since the optimum capacitor used for the impedance matching is $Z_{L1}=Z_{L2}=Z_0=50Ω$, the transfer efficiency is lower than the maximum transfer efficiency according to the change of the load. In particular, as $Z_{L1}$ increases, the efficiency decreases. It is possible to obtain the maximum transfer efficiency by using the optimum capacitor value matching the impedance of $Z_{L1}$ and $Z_{L2}$. When determined from the results of FIGS. 14 and 15, in a case where the SP type is applied to the reception impedance matching unit of the battery charging device, the reception efficiencies of the first power reception unit and the second power reception unit are within about ±10% based on 45% according to the change in the load impedances of the first power reception unit and the second power reception unit. This result shows that, when the SP type is applied to the reception unit, the charging is performed within a constant power transfer efficiency range even if the impedance of the reception circuit including the arbitrary load or the battery being charged is changed. Therefore, when the PS or SP matching structure is used in the transmission unit and when the change of the individual load is great or the power is intended to be transmitted at a constant rate with respect to the change of the load, it is preferable to use the SP capacitive matching structure in the receiver.

Figure 16:
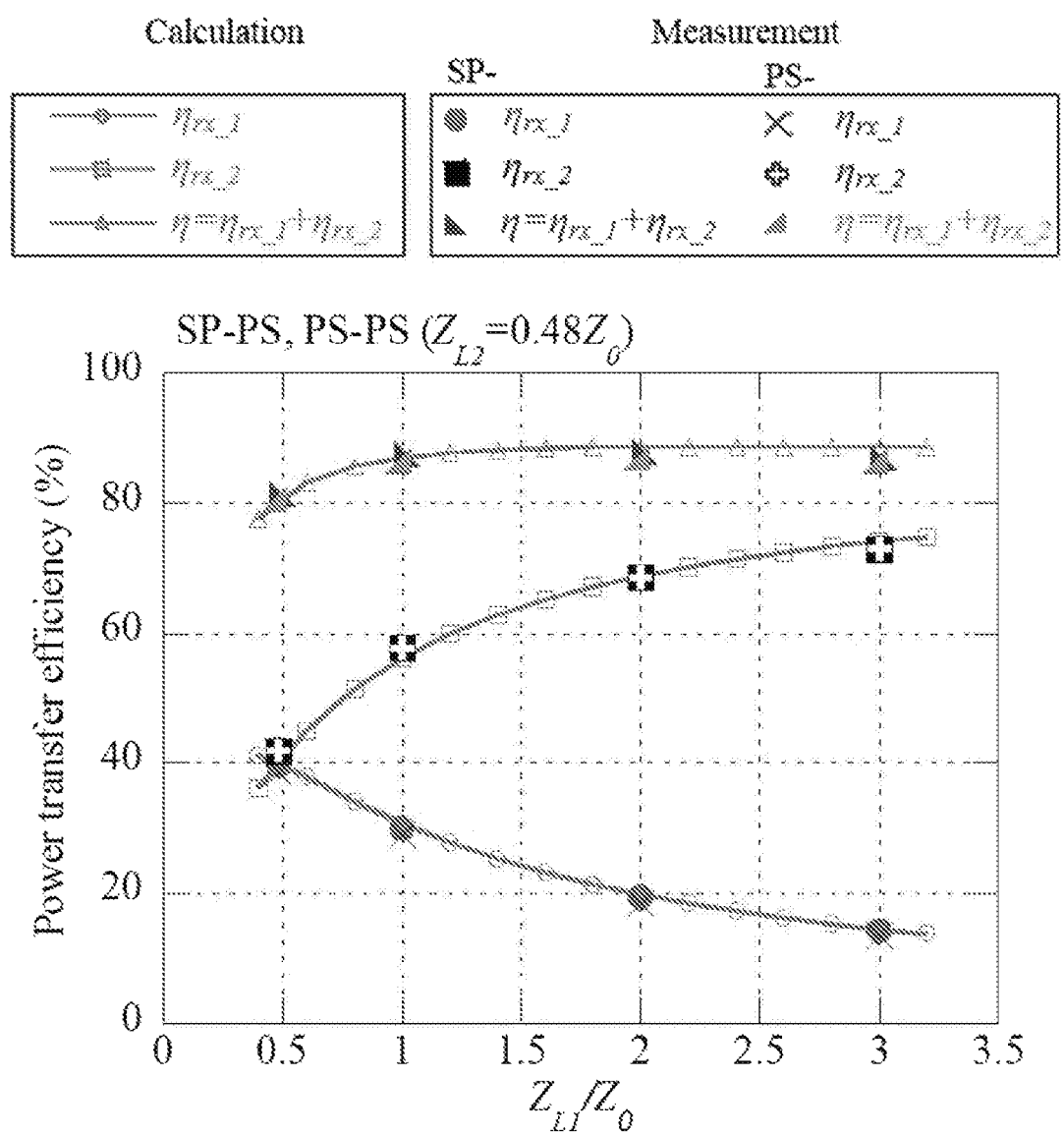
Figure 17:
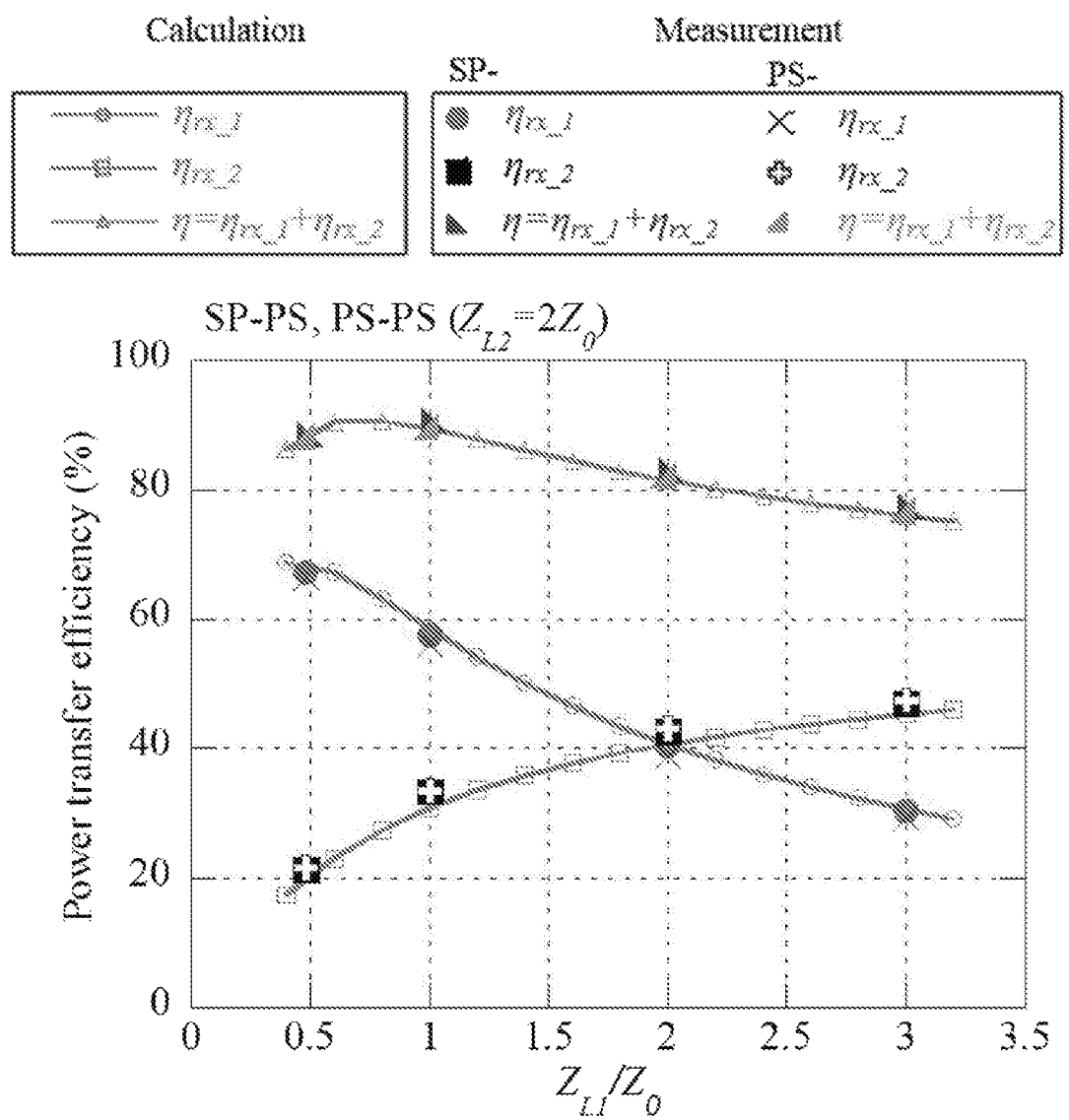

FIGS. 16 and 17 illustrate a case where the PS type is applied to the reception impedance matching unit of the battery charging device. SP-PS is a case where the SP type is applied to the transmission impedance matching unit of the charging power supply device and the PS type is applied to the reception impedance matching unit of the battery charging device, and PS-PS is a case where the PS type is applied to the transmission impedance matching unit of the charging power supply device and the PS type is applied to the reception impedance matching unit of the battery charging device.

FIG. 16 shows the power transfer efficiency with respect to $Z_{L1}/Z_0$. $Z_{L2}$ represents the load of the reception unit, and the value thereof is fixed to $0.48Z_0$. $Z_o$ is set to 50Ω. The simulation calculation result is indicated by a solid line, and the measurement results are values measured when $Z_{L1}/Z_0$ is 0.5, 1, 2, and 3.

The efficiencies for the first and second power reception units are represented by $\eta_{rx\_1}$ and $\eta_{rx\_2}$, and the total efficiency obtained by adding the efficiencies of the two loads is represented by $\eta$.

FIG. 17 shows the transfer efficiency of $Z_{L1}/Z_0$ for the case where $Z_{L2}$ is fixed to $2Z_0$ while the same configuration as that of FIG. 16 is applied.

When determined from the results of FIGS. 16 and 17, the transmission impedance matching unit of the charging power supply device shows the same result values, regardless of the selection of the SP type and the PS type. Similarly to the case where the reception matching unit is SP, it can also be seen that the efficiencies of the two loads are the same when $Z_{L1}$ and $Z_{L2}$ are the same.

However, the power transfer efficiency at each load is greatly different according to the ratio of $Z_{L1}/Z_{L2}$. That is, as the $Z_{L1}/Z_{L2}$ is smaller than 1, the efficiency of the first power reception unit gradually increases, and as the $Z_{L1}/Z_{L2}$ is larger than 1, the efficiency of the second power reception unit gradually increases.

When determined from the results of FIGS. 16 and 17, in a case where the PS type is applied to the reception impedance matching unit of the battery charging device, the power transfer efficiency is greatly changed according to the load impedances of the first power reception unit and the second power reception unit.

For example, when $Z_{L1}/Z_0$ is 0.5 in FIG. 17 where $Z_{L2}$ is $2Z_0$, it can be seen that the impedance of the first power reception unit is low and the transmission power is larger than that of the second power reception unit. This feature is very advantageous for charging a plurality of loads and batteries. That is, a general battery charging method is a constant voltage mode when the charging amount is small, and changes to a constant current mode when much charging is performed. In this case, it is preferable to charge the battery by receiving a large amount of power in the constant voltage mode. In the constant current mode, it is preferable to charge the battery by receiving a small amount of power. In the constant voltage mode, it can be seen from a voltage-to-current ratio that the voltage is fixed but the current increases. Thus, the impedance is low and the constant current mode is opposite.

Therefore, in a case where the PS or SP matching structure is used in the transmission unit, when it is intended to control the amount of power transmission according to the impedance ratio of the individual loads (more power is supplied to the lower impedance when looking at the reception circuit), it is appropriate to use a PS capacitive matching structure in the receiver. Based on the test results shown in FIGS. 14 to 17, the transmission impedance matching unit of the charging power supply device is not affected even though either the SP type or the PS type is selected. However, the charging characteristics of the reception impedance matching unit of the battery charging device varies according to which type of the SP type and the PS type is selected.

That is, when the reception impedance matching unit of the battery charging device is configured as the SP type, the same charging can be performed regardless of the charging demand amount, unique characteristics, or the like for a plurality of batteries requiring charging, and when the reception impedance matching unit of the battery charging device is configured as the PS type, charging can be differently performed according to the charging demand amount, unique characteristics, or the like for a plurality of batteries requiring charging.

On the other hand, when the reception impedance matching unit of the battery charging device is configured as the PS type, in the case of a battery having a high charging demand amount for relatively full charging among a plurality of batteries or loads, charging is relatively quickly performed as compared with other batteries.

Therefore, in an embodiment of the present invention, a battery charging system using wireless power transmission may include: a charging power supply device including at least one power transmission coil and capable of simultaneously transmitting power wirelessly to one or more battery charging devices; and a battery charging device including a power reception unit including a power reception coil that receives power wirelessly transmitted from the charging power supply device, a battery charging unit that supplies power received from the power reception unit to the battery, and a reception impedance matching unit that performs impedance matching between the power reception unit and the battery charging unit, wherein the reception impedance matching unit may include a first reception capacitor connected in parallel to the power reception unit and a second reception capacitor connected in series to the first reception capacitor connected in parallel to the power reception unit.

Furthermore, the battery charging device may further include a control unit that controls power charged in each battery by adjusting impedance matching of the reception impedance matching unit. In particular, the control unit may adjust the impedance matching of the reception impedance matching unit to lower input impedance of the battery charging unit when viewed from the power reception unit, so as to increase a ratio of power supplied to the battery charging unit among the powers transmitted from the charging power supply device.

In addition, the control unit may collect state information on a plurality of batteries from a plurality of battery charging units, select one or more battery charging units to concentrate and distribute charging power based on the state information, and adjust impedance matching of the reception impedance matching unit corresponding to the one or more battery charging units to lower input impedance of the battery charging unit when viewed from the power reception unit, so as to increase a ratio of power supplied to the one or more battery charging units among the powers transmitted to the charging power supply device.

Therefore, when the PS-type structure is applied to the battery charging device, the power distributed to each load may be effectively controlled while adjusting the input power transmitted from the charging power supply unit to the reception impedance matching unit of the battery charging device. To this end, a method of adjusting a capacitor value of the reception impedance matching unit may be used. In addition, in applying the PS-type structure, a reception self-resonant coil and a reception coupling coil may be used together as described above.

For example, when a tablet PC and a smart watch are simultaneously charged, the tablet PC typically requires a large amount of power for charging, whereas the smart watch requires a relatively small amount of power. In addition, considering the case of charging a plurality of homogeneous terminals having different charging states, a battery of one terminal may be almost charged, but a battery of other terminals may be in a state of a very small charging amount. In such a case, it is preferable that more power is transmitted to the battery of the terminal having a very small charging amount.

Therefore, in this case, the battery charging device may be configured by applying the PS-type structure, so that the power is automatically distributed according to the impedance of the load. Further, if necessary, the capacitor value of the reception impedance matching unit is adjusted, so that the power is appropriately supplied by taking into account the power required by the load.

On the other hand, if the SP-type structure is applied in configuring the battery charging device, when the power transmitted from the charging power supply device is required to simultaneously charge loads having different characteristics, power has to be transmitted to the load requiring the lowest power. Thus, It may be very inefficient in terms of charging the load requiring higher power. Similarly, even in the case of charging homogeneous loads such as the same kind of terminals, the total power transmitted from the charging power supply device must be determined according to the load state requiring the lowest power. That is, power is supplied to each battery based on the battery having the highest charging amount. Therefore, in the case of a battery in which the charging amount charged at the same time is insufficient, the charging efficiency may be significantly lowered.

In addition, in an embodiment of the present invention, it is possible to configure a battery charging system using wireless power transmission, including a battery charging device to which an SP-type structure is applied.

Therefore, a battery charging system using wireless power transmission, according to an embodiment of the present invention, includes: a charging power supply device including at least one power transmission coil and capable of simultaneously transmitting power wirelessly to one or more battery charging devices; a battery charging device including a power reception unit including a power reception coil that receives power wirelessly transmitted from the charging power supply device, a battery charging unit that supplies the power received from the power reception unit to the battery, and a reception impedance matching unit that performs impedance matching between the power reception unit and the battery charging unit.

In this case, the reception impedance matching unit may include a first reception capacitor connected in series to the power reception unit and a second reception capacitor connected in parallel to the first reception capacitor connected in series to the power reception unit.

The method of applying the SP-type structure to the battery charging device also has advantages according to the method. For example, when the change in the input impedance of the battery charging unit is very large according to the state of the battery in the battery charging device, the power may be constantly supplied by applying the SP-type structure to the battery charging device, even though the input impedance of the battery charging unit is changed. Therefore, when the impedances of the plurality of loads are adjusted within a range of several times, the battery charging device may almost constantly supply power.

When the charging power supply device supplies too much power to the battery charging device, the battery charging device may cause problems such as heat generation or malfunction. Therefore, the charging may be performed more efficiently and stably for various charging conditions by appropriately selecting and applying the PS-type or SP-type structure according to the application field as described above.

The battery charging system using wireless power transmission, according to the present invention, may simultaneously charge a plurality of unit batteries and loads with one charging power supply device, that is, one transmission module. In particular, by configuring the reception impedance matching unit in a PS type by using a capacitive matching structure, it is possible to automatically transmit more power to a receiver having low impedance according to a change in the impedance of the load.

The above description is merely illustrative of the technical idea of the present invention, and various modifications and changes may be made thereto by those skilled in the art without departing from the essential characteristics of the present invention. Therefore, the embodiments of the present invention are not intended to limit the technical spirit of the present invention but to illustrate the technical idea of the present invention, and the technical spirit of the present invention is not limited by these embodiments. The scope of protection of the present invention should be interpreted by the appending claims, and all technical ideas within the scope of equivalents should be construed as falling within the scope of the present invention.

The invention claimed is:

1. A battery charging system using wireless power transmission, comprising:
a charging power supply device that comprises at least one power transmission coil and wirelessly transmits power for simultaneously charging a plurality of batteries; and
a battery charging device that receives power wirelessly transmitted from the charging power supply device through a plurality of power reception coils respectively corresponding to the plurality of batteries and that simultaneously charges the plurality of batteries, the battery charging device comprising:
a reception control unit that controls power charged to each battery by taking into account a charging state of each of the plurality of batteries, and
a plurality of reception impedance matching units respectively corresponding to the plurality of batteries,
wherein the battery charging device controls the plurality of reception impedance matching units according to the respective charging states of the plurality of batteries to simultaneously supply power to each battery, and
wherein the reception control unit selects a battery of the plurality to concentrate charging power to and adjusts an impedance of a reception impedance matching unit corresponding to the selected battery to increase a ratio of power supplied to the battery to power simultaneously supplied through the plurality of power reception coils by the charging power supply device.

2. The battery charging system of claim 1, wherein the reception control unit is provided in plurality to individually correspond to the plurality of batteries.

3. The battery charging system of claim 1, wherein the reception control unit is implemented with one module that controls charging of the plurality of batteries.

4. The battery charging system of claim 1, wherein the reception impedance matching units each comprise a first reception capacitor connected in parallel to an input terminal and a second reception capacitor connected in series to the first reception capacitor.

5. The battery charging system of claim 1, wherein the reception impedance matching units each comprise a first reception capacitor connected in series to an input terminal and a second reception capacitor connected in parallel to the first reception capacitor.

6. The battery charging system of claim 1, wherein the charging power supply device comprises a transmission control unit that controls the wirelessly transmitted power, and
the transmission control unit and the reception control unit interwork with each other to adjust the wirelessly transmitted power and the charged power.

7. The battery charging system of claim 6, wherein the transmission control unit comprises a transmission communication unit for wired or wireless communication with the reception control unit,
the reception control unit comprises a reception communication unit for wired or wireless communication with the transmission control unit, and
the transmission control unit controls a transmission power amount based on charging state information of the plurality of batteries that is transmitted from the reception control unit.

8. The battery charging system of claim 6, wherein the reception impedance matching units each comprise a first reception capacitor connected in parallel to an input terminal and a second reception capacitor connected in series to the first reception capacitor.

9. The battery charging system of claim 6, wherein the reception impedance matching units each comprise a first reception capacitor connected in series to an input terminal and a second reception capacitor connected in parallel to the first reception capacitor.

10. The battery charging system of claim 6, wherein the transmission control unit of the charging power supply device adjusts impedance of an impedance matching unit to control power supplied to the power transmission coil.

11. The battery charging system of claim 1, wherein the reception control unit of the battery charging device adjusts impedance of an impedance matching unit of each battery to control power charged to each battery.

12. The battery charging system of claim 1, wherein the control unit collects state information on the plurality of batteries from a plurality of battery charging units respectively, and adjusts impedance matching of the plurality of reception impedance matching units based on the state information, so as to adjust the ratio of power supplied to the battery to the power simultaneously supplied through the plurality of power reception coils by the charging power supply device.

13. The battery charging system of claim 1, wherein when the impedances of the reception impedance matching units are changed, each of the batteries is charged within a predetermined power transfer efficiency range.

14. The battery charging system of claim 1, wherein the charging power supply device comprises a wireless power transmission device capable of wirelessly transmitting power to a plurality of wireless power reception devices in a wireless power transmission system, the wireless power transmission device comprising:
a power transmission unit that comprises the at least one power transmission coil and transmits power to the wireless power reception devices;
a power supply unit that supplies power to the power transmission unit;
a transmission impedance matching unit that adjusts impedance between the power supply unit and the power transmission unit; and
a transmission control unit that controls the power wirelessly transmitted simultaneously to the plurality of wireless power reception devices and that communicates with a plurality of reception control units, the plurality of reception control units being respectively included in the plurality of wireless power reception devices, wherein the transmission control unit receives from the plurality of reception control units the charging state information of respective batteries of the plurality of wireless power reception devices and controls the wirelessly transmitted power based on the charging state information to simultaneously charge the respective batteries of the plurality of wireless power reception devices, and wherein the plurality of wireless power reception devices includes the battery charging device, wherein the plurality of reception control units includes the reception control unit of the battery charging device, and wherein the plurality of batteries includes the respective batteries of the plurality of wireless power reception devices.

15. The battery charging system of claim 1, wherein the battery charging device includes a wireless power reception device that receives power from a wireless power transmission device capable of wirelessly transmitting power simultaneously to a plurality of wireless power reception devices in a wireless power transmission system, the wireless power transmission device including the charging power supply device, and the wireless power reception device comprising:
  a power reception unit comprising a power reception coil of the plurality of power reception coils, the power reception unit configured to receive power wirelessly transmitted from the wireless power transmission device;
  a module power supply unit that supplies the power received from the power reception unit to a module, the module including at least one battery of the plurality of batteries;
  a reception impedance matching unit corresponding to the module that performs impedance matching between the power reception unit and the module power supply unit, wherein the reception control unit [[that]] controls power supplied to the module by taking into account a charging state of the module and communicates with the wireless power transmission device, and wherein the reception control unit transmits information regarding the charging state of the module to the wireless power transmission device.

16. The wireless power reception device of claim 15, wherein the reception control unit controls power supplied to the module by controlling an impedance of the reception impedance matching unit corresponding to the module.

17. The wireless power reception device of claim 16, wherein the module power supply unit measures the state of the module, and
  wherein the reception control unit controls the impedance of the reception impedance matching unit corresponding to the module according to the state of the module measured by the module power supply unit.

18. The wireless power reception device of claim 15, wherein the reception impedance matching unit corresponding to the module comprises a first reception capacitor connected in parallel to the power supply unit and a second reception capacitor connected in series to the first reception capacitor.

19. The wireless power reception device of claim 15, wherein the reception impedance matching unit corresponding to the module comprises a first reception capacitor connected in series to the power supply unit and a second reception capacitor connected in parallel to the first reception capacitor.

20. The wireless power reception device of claim 15, wherein the information regarding the charging state of the module includes information regarding an amount of charging of the module.

* * * * *